(12) United States Patent
Leroux

(10) Patent No.: US 6,639,676 B1
(45) Date of Patent: Oct. 28, 2003

(54) METHOD FOR DETERMINING ROTATIONAL ERROR PORTION OF TOTAL MISALIGNMENT ERROR IN A STEPPER

(75) Inventor: Pierre Leroux, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/422,909

(22) Filed: Oct. 21, 1999

(51) Int. Cl.$^7$ .............................................. G01B 11/00
(52) U.S. Cl. ...................................................... 356/401
(58) Field of Search .............................. 354/400, 401; 430/22, 30

(56) References Cited

U.S. PATENT DOCUMENTS

| | | | |
|---|---|---|---|
| 4,057,347 A | * 11/1977 | Moriyama et al. | ....... 250/491.1 |
| 4,798,470 A | * 1/1989 | Moriyama et al. | .......... 356/401 |
| 4,908,656 A | 3/1990 | Suwa et al. | .................... 355/53 |
| 5,444,538 A | * 8/1995 | Pellegrini | ..................... 355/53 |
| 5,621,813 A | * 4/1997 | Brown et al. | ................. 348/95 |
| 5,633,505 A | * 5/1997 | Chung et al. | ............ 250/491.1 |
| 5,666,205 A | 9/1997 | Tateno et al. | ............... 356/401 |
| 5,868,560 A | 2/1999 | Tamada et al. | ................. 430/5 |
| 6,023,338 A | * 2/2000 | Bareket | ..................... 356/401 |
| 6,258,611 B1 | * 7/2001 | Leroux | ....................... 430/312 |

* cited by examiner

Primary Examiner—Zandra V. Smith
(74) Attorney, Agent, or Firm—Peter Zawilski

(57) ABSTRACT

A method for determining rotational error portion of total misalignment error in a stepper. In one embodiment, the method comprises a series of steps in a stepper, starting with the step of receiving a wafer, having a first pattern and an error-free fine alignment target, in the stepper. In another step, the wafer is aligned in the stepper using the error-free fine alignment target. Then a second pattern is created on the wafer overlaying said first pattern. In another step, the rotational error portion of the total misalignment error is determined by measuring the circumferential misalignment between the first pattern and the second pattern.

12 Claims, 16 Drawing Sheets

200a

METHOD FOR DETERMINING ROTATIONAL ERROR PORTION OF TOTAL MISALIGNMENT ERROR IN A STEPPER

TECHNICAL FIELD

The present claimed invention relates to the field of semiconductor wafer fabrication. More specifically, the present claimed invention relates to a method for determining the rotational portion of misalignment error in a stepper used to fabricate patterned layers on a wafer.

BACKGROUND ART

Integrated circuits (ICs) are fabricated en masse on silicon wafers using well-known photolithography, etching, deposition, and polishing techniques. These techniques are used to define the size and shape of components and interconnects within a given layer of material built on a wafer. The IC is essentially built-up using a multitude of interconnecting layers, one formed on top of another. Because the layers interconnect, a need arises for ensuring that the patterns on adjacent layers of the wafer are accurately formed.

Accurate formation of an image on a wafer using photolithography depends on several error-causing variables. These variables include, but are not limited to, rotational alignment error, translational alignment error, and magnification error, between the reticle and the wafer. The rotational error is one of the more important variables for accurately forming an image on a wafer. Precise rotational alignment of images formed on each layer is critical for several reasons. For example, proper rotational alignment is necessary to accurately shape and size devices for proper performance, as well as to ensure proper location of insulators and interconnecting conductors. Hence, a need arises for ensuring accurate rotational alignment of an image from a reticle formed on a layer of a wafer.

Each one of the error-causing variables can be corrected by a different part of the stepper. If errors are not segregated and measured independently, then the error measurements are confounded, and the resulting corrections for each variable may be contradictory and self-defeating. Thus, a need arises for a method to segregate other error-causing variables, such as magnification error and translational error, from the rotational error, so as to yield a true rotational error measurement.

Referring now to prior art FIG. 1A, a top view of a conventional alignment reticle is shown. Alignment reticle 126 includes multiple overlay patterns 110a–110e, and a fine alignment target 132 located at an outer portion of the alignment reticle 100b. Each overlay pattern 110a–110e includes a first overlay box 130a and a second overlay box 130b, though only shown in overlay pattern 110a for clarity. Hence, the fine alignment target 132 is located a significant distance, 136 and 138, away from small overlay box 130a and large overlay box 130b. Large overlay box 130b is offset from small overlay box 130a by a distance 140.

The conventional alignment reticle and conventional rotational error measurement process is corrupted by using an alignment target having magnification error, rotational error, and translational error. The conventional reticle includes an alignment target at an outer location of the reticle image, 132 of prior art FIG. 1B and 126b of prior art FIG. 1A, that is projected through an outer portion 128b of the lens 128 of prior art FIG. 1A. Consequently, the alignment target created on the wafer suffers from magnification error, rotational error and translational error as well as reticle writing error. Furthermore, the conventional rotational error measurement process compares a full-field shot on each of two layers. However, a full-field shot includes errors other than rotational error. Hence, the rotational error measurement is confounded with other these other errors. Consequently, the rotational error measurement may not be accurate, and thus compromise yield of the wafer and performance of the IC formed on the wafer. Hence, a need arises for a more accurate reticle and for more accurate shots on a wafer, with which rotational error can be measured.

Additionally, the conventional fine alignment target includes duplicative magnification error. Magnification error, such as lens distortion, typically increases towards the outer regions of the lens, due to factors such as lens irregularities and to properties of light. Additionally, the alignment target created on the wafer suffers from reticle writing error because it is located a significant distance, e.g. 136 and 138 of prior art FIG. 1B, away from the overlay patterns, e.g. 110a and 110e, used to measure the magnification error of the stepper. That is, reticle writing error can have an error rate, linear or exponential, that accumulates over the distance between two images on the reticle. Hence, if an overlay pattern is located far away from an alignment target, then the prior art rotational error measurement will be measuring the translational misalignment and rotational error of the alignment target, along with the magnification error of the stepper.

Furthermore, a large distance between the overlay pattern and the alignment targets only serves to amplify any processing error for the steps used in the alignment process, e.g. rotational error. For example, if the wafer is realigned in the stepper using a charge coupled device (CCD) and digital signal processing for pattern matching, both having a given tolerance, then this tolerance may be amplified at a location far from the alignment target. In one instance, a given rotational error at the alignment will increase with the distance, or radius, from the alignment target. This scenario is shown in the following figure, prior art FIG. 1B. Consequently, a need arises for creating an error-free alignment target. More specifically, a need arises for a method to measure rotational error using an alignment target that does not include reticle writing error, translational error, rotational error, and magnification error.

Referring now to prior art FIG. 1B, an example of a Preventative Maintenance (PM) wafer 150 with overlay boxes created therein is shown. Only one shot, shot 160b, is shown in this figure for clarity. Shot 150 has a small overlay box 160a and a large overlay box 160b, and a fine alignment target 162 formed therein. Alignment reticle 126 of prior art FIG. 1A is used to create the overlay boxes on wafer 150. However, in this example, rotational error occurs when the stepper did not accurately align to fine alignment target 162. This situation arises for the process that formed the second overlay box 160b on wafer 150. Even though the rotational error during alignment was a small angle 164, the large distance 166 between fine alignment target 162 and overlay box 160a magnifies the error to a substantial X error 162 and Y error 164. Part of this rotational error, as well as any other error that occurs, may be interpreted as a rotational error occurring from the placement of boxes 160b and 160a. Instead, part of the rotational error between boxes 160b and 160a comes from the fine alignment target. Consequently, the prior art alignment rotational error measurement and misalignment measurement process may actually overcorrect the stepper and possibly cause more error than originally existed.

Confounding the rotational error also occurs by not separating out a translational portion of the misalignment error prior to forming images on a wafer for the rotational error measurement. The alignment of a wafer for a rotational error measurement process intrinsically includes a translational error. Conventionally, the translational error is not accounted for in a rotational error measurement. If this error is not compensated for, it will affect the results of the rotational error measurement. Thus, by using the rotational level to compensate for the translational portion of the alignment error, alignment accuracy can possibly be degraded, due to miscorrection.

Consequently, a need arises for compensating for the transitional error in the rotational error measurement.

The confounding of errors in the conventional rotational error measurement process becomes important when considering budget overlay requirements. Budget overlay is a value associated with the allowable tolerance for manufacturing a given size of photolithography imprint. For example, a 0.2 micron technology would typically have a 0.08 micron budget overlay. However, as demand increases for smaller and smaller images, the budget overlay must decrease as well. For example, the current 0.12 micron technology only allows approximately a 0.055 micron budget overlay. Consequently, as budget overlay decreases, the error in the misalignment measurement becomes more significant. Thus, the aforementioned needs to improve accuracy of the rotational error measurement arise in light of more stringent budget overlay requirements.

In summary, a need arises for ensuring accurate alignment of multiple layers formed on a wafer. More specifically, a need arises for ensuring accurate rotational alignment of an image formed on a layer of a wafer from a reticle. Also, a need arises for a method to segregate other error-causing variables, such as magnification error and translational error, from the rotational error, so as to yield a true rotational error measurement. A need also arises for a method to measure rotational error using an alignment target without reticle writing error, translational error, rotational error, and magnification error. Furthermore, a need arises for compensating the stepper for the transitional error prior to the rotational error measurement. These needs to improve accuracy of the rotational error measurement arise in light of more stringent budget overlay requirements.

DISCLOSURE OF THE INVENTION

The present invention provides a method and an apparatus for ensuring accurate alignment of multiple layers formed on a wafer. More specifically, the present invention provides accurate rotational alignment of an image formed on a layer of a wafer from a reticle. The present invention accomplishes accurate rotational alignment by segregating other error-causing variables from the rotational misalignment error, so as to yield a true magnification error measurement. Additionally, the present invention provides a method for measuring magnification error using an alignment target that is approximately free of reticle writing error, magnification error, rotational error, and translational error. Furthermore, the present invention compensates for the transitional error in the stepper prior to the magnification error measurement. Thus, the present invention improves accuracy of the magnification error measurement, thereby satiating more stringent budget overlay requirements.

In particular, the present invention provides a method for determining the rotational error portion of total misalignment error in a stepper. In one embodiment, the method comprises a series of steps in a stepper, starting with the step of receiving a wafer, having a first pattern and an error-free fine alignment target, in the stepper. Then the stepper is adjusted for the translational error portion of the total misalignment, which was measured by another process. In another step, the wafer is aligned in the stepper using the error-free fine alignment target. Then a second pattern is created on the wafer overlaying said first pattern. In another step, the rotational error portion of the total misalignment error is determined by measuring the circumferential misalignment between the first pattern and the second pattern. By comparing the two sets of patterns, the present invention provides a method by which rotational error can be isolated and accounted for in the stepper. In one embodiment, the present invention may be thought of as creating an error-free alignment pattern within the wafer, over which alignment patterns with rotational-error will be placed. By comparing the two sets of patterns, the present invention provides a method by which rotational error can be isolated.

In another embodiment, the present invention recites a stepper that includes a processor and a computer readable memory. The memory contains program instructions and data that, when executed via the processor, implement the aforementioned method for determining rotational error in the stepper.

These and other objects and advantages of the present invention will no doubt become obvious to those of ordinary skill in the art after having read the following detailed description of the preferred embodiments illustrated in the various drawing figures.

BRIEF DESCRIPTION OF THE DRAWINGS

The accompanying drawings, which are incorporated in, and form part of, this specification, illustrate embodiments of the invention and, together with the description, serve to explain the principles of the invention. The drawings referred to in this description should be understood as not being drawn to scale except as specifically noted.

PRIOR ART

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention can be practiced without these specific details. In other instances, well-known methods, procedures, components, and materials have not been described in detail so as not to unnecessarily obscure aspects of the present invention.

Some portions of the detailed descriptions which follow, e.g. the processes, are presented in terms of procedures, logic blocks, processing, and other symbolic representations of operations for fabricating patterned layers, e.g. ICs, on a wafer. These descriptions and representations are the means used by those skilled in the art of wafer fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of applying material, removing material, or changing the state or structure of a material on a wafer by chemical, optical, and mechanical means.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, terms such as or "receiving," "aligning," "creating," "measuring," "compensating," "exposing," "projecting," "forming," or the like, refer to the action and processes of fabricating material and patterns on a wafer.

Figure 1A:
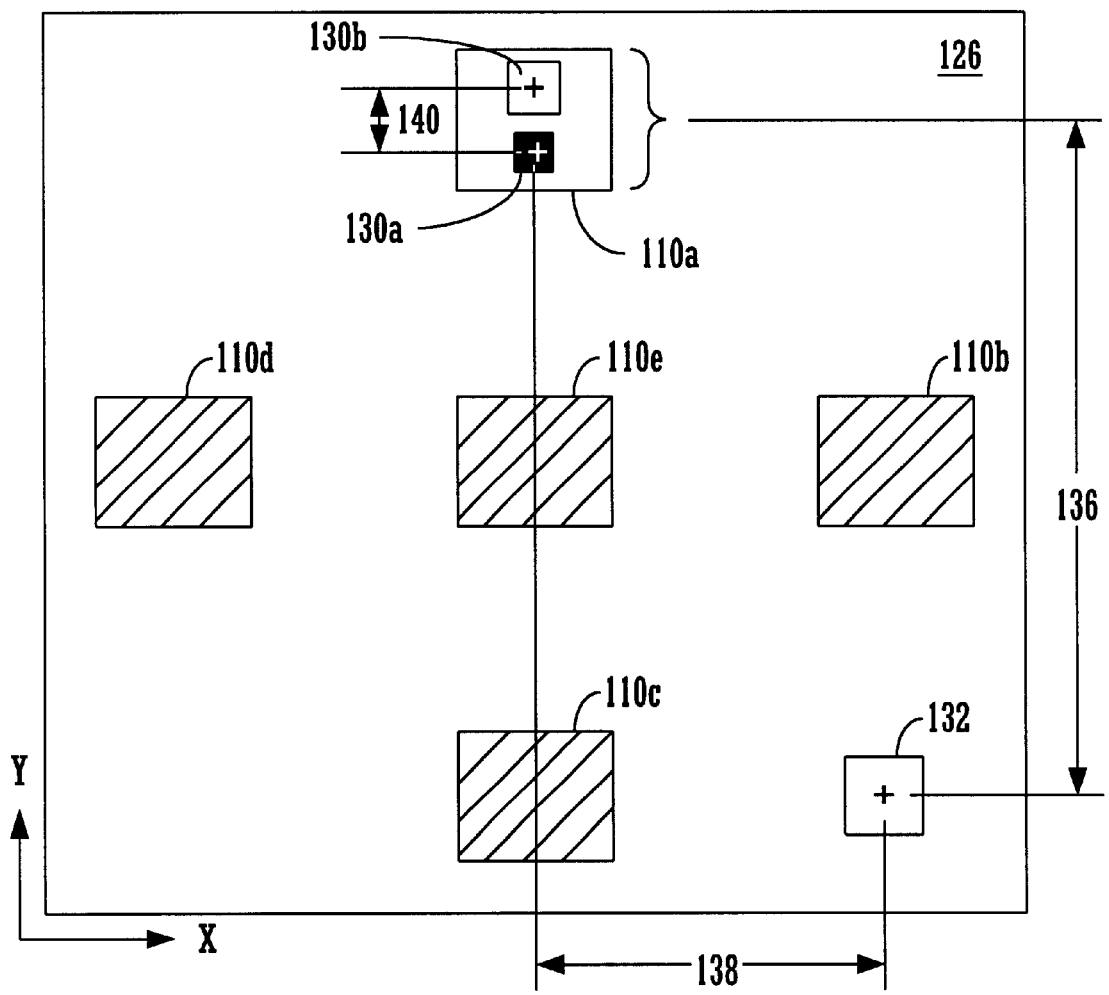
FIG. 1A is a top view of a conventional alignment reticle is shown.
Figure 1B:
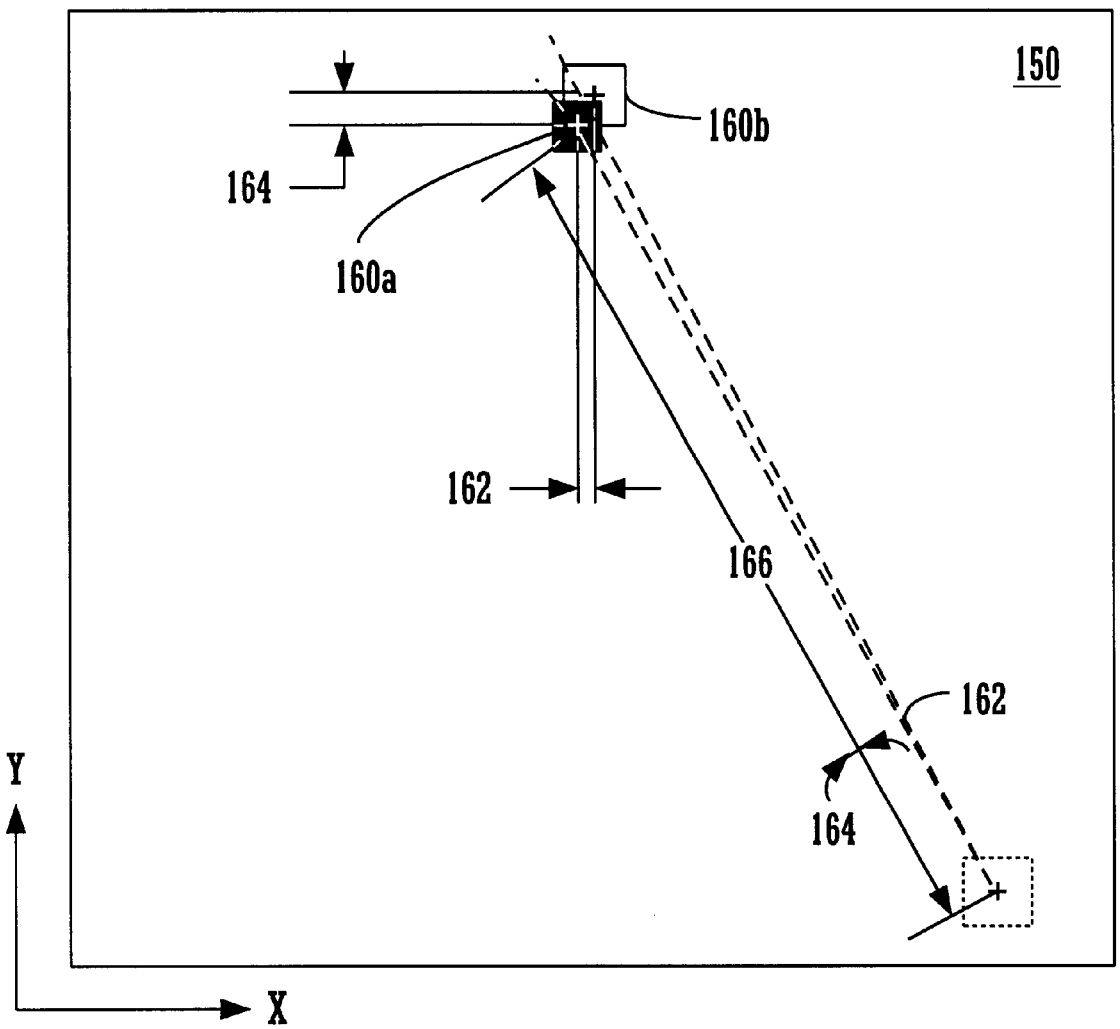
FIG. 1B is a Preventative Maintenance (PM) wafer with overlay boxes created therein.
Figure 2:
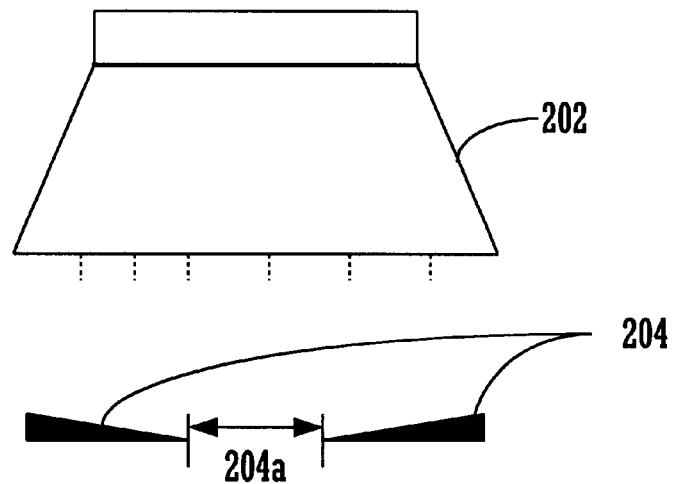
FIG. 2 is a side view of a stepper, in accordance with one embodiment of the present invention.
Figure 2:
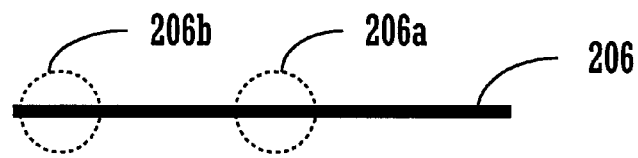
Figure 2:
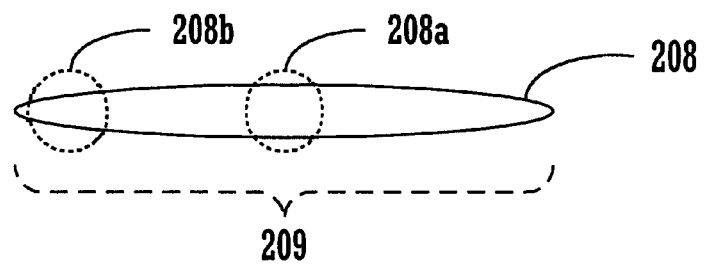
Figure 2:
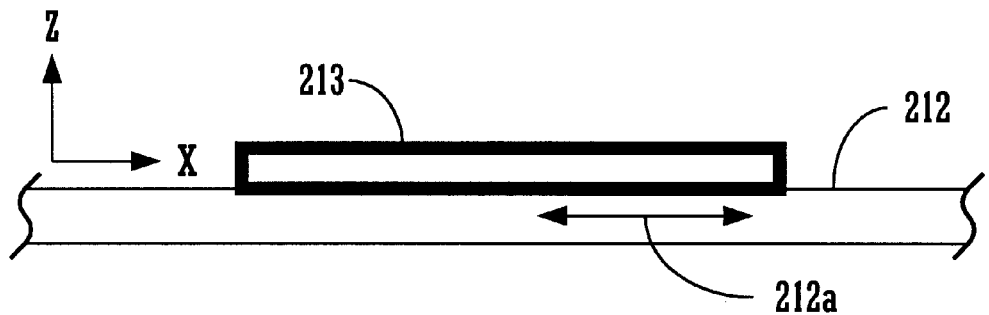

Referring now to FIG. 2, a side view of a stepper is shown. Stepper 200a includes a light source 202, masking blades 204, a reticle 206, a lens 208, and a stage 212. The light source 202 projects light through an opening 206a of masking blades 204, through the transparent portion of a pattern on a reticle 206A, through lens 208 and onto a wafer 213, located on the stage 212. By doing so, the pattern of the reticle 206 is reproduced on the wafer 213, typically at a 5:1 reduction. However, any magnification level can be used. A pattern located on an inner, or center, portion 206a of the reticle 206, passes through a center portion 208a of lens 208. Similarly, a pattern located on an outer, or peripheral, portion 206b of the reticle 206, passes through an outer portion 208b of lens 208.

Figure 3A:
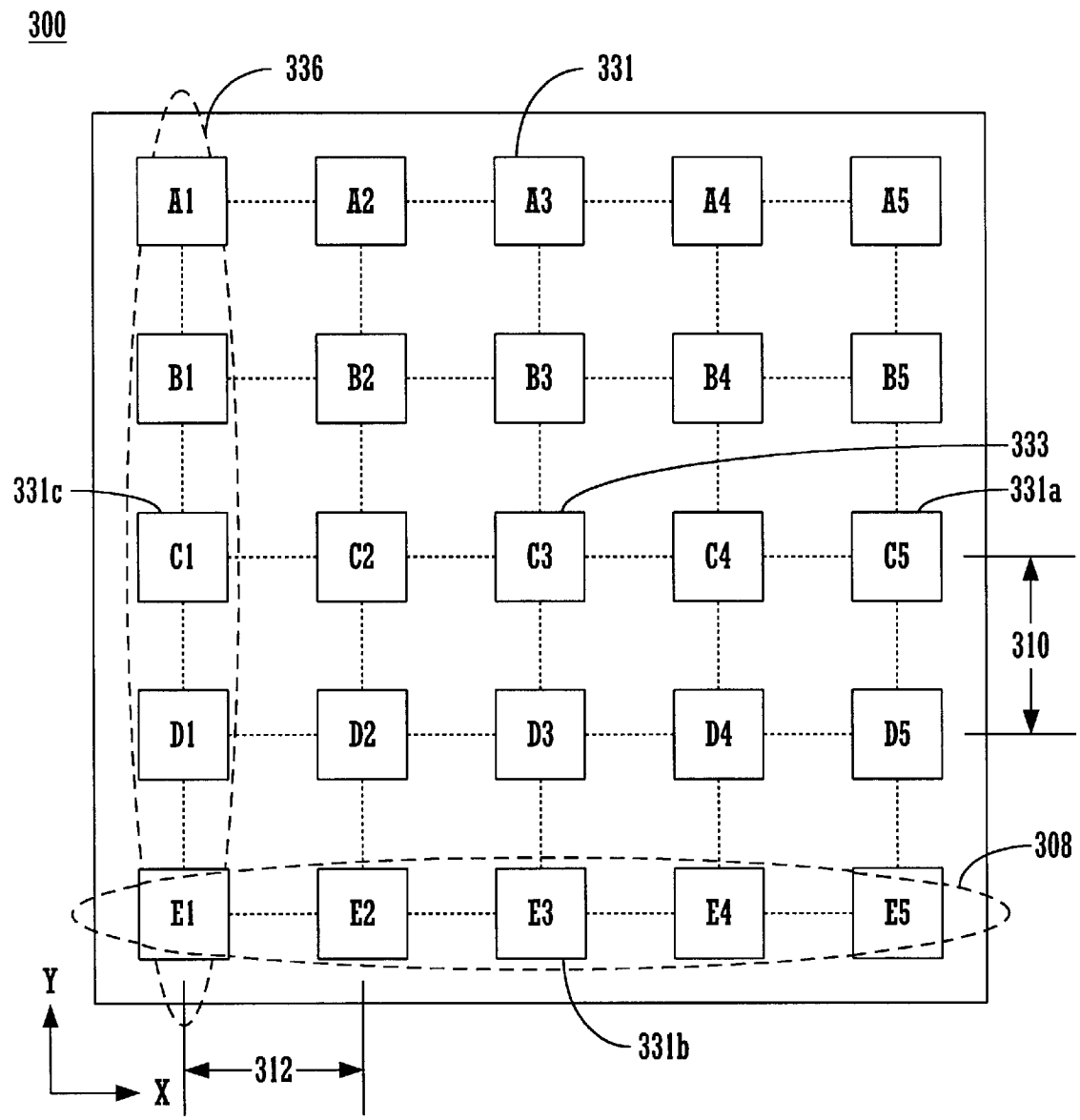
FIG. 3A is a top view of an alignment reticle, in accordance with one embodiment of the present invention.

Referring now to FIG. 3A, an alignment reticle is shown, in accordance with one embodiment of the present invention. FIG. 3A shows alignment reticle 300 in a top view. Alignment reticle 300 is a matrix of pattern boxes. The dashed lines in FIG. 3A represent a matrix grid on which the pattern boxes lay. The matrix includes multiple rows, e.g. row 308, of pattern boxes, e.g. E1–E5, offset by a constant pitch 310, and columns, e.g. 336, of pattern boxes, e.g. A1–E1, offset by a constant pitch 312. The pitch can be variable in another embodiment. In one embodiment, alignment reticle 300 includes a center portion 333, shown as pattern box C3, and an outer region, shown as pattern boxes E1–E5, D1–D5, C1–C2, C4–C5, B1–B5, and A1–A5. While the present embodiment shows a specific configuration and spacing of pattern boxes A1–E5, the present invention is suitable to an alignment reticle having other patterned shapes and spacing. Pattern boxes located in outer region of shot, e.g. pattern boxes E3 331, C5 331b, A3 331b, and C1 331c, will be utilized by a subsequent flowchart.

Pattern box C3 in center portion 333 of alignment reticle 300 of FIG. 3A includes a first pattern, having a fine alignment target, and includes a second pattern, both of which are shown in subsequent figures. By locating the fine alignment target in the center portion 333 of alignment reticle 300, the present invention can more accurately locate to the fine alignment target during the translational misalignment measurement process. More specifically, the present invention eliminates other sources of error, such as. lens distortion, reticle writing error, and rotational misalignment from the fine alignment target by locating the fine alignment target in the center of the reticle.

Figure 3B:
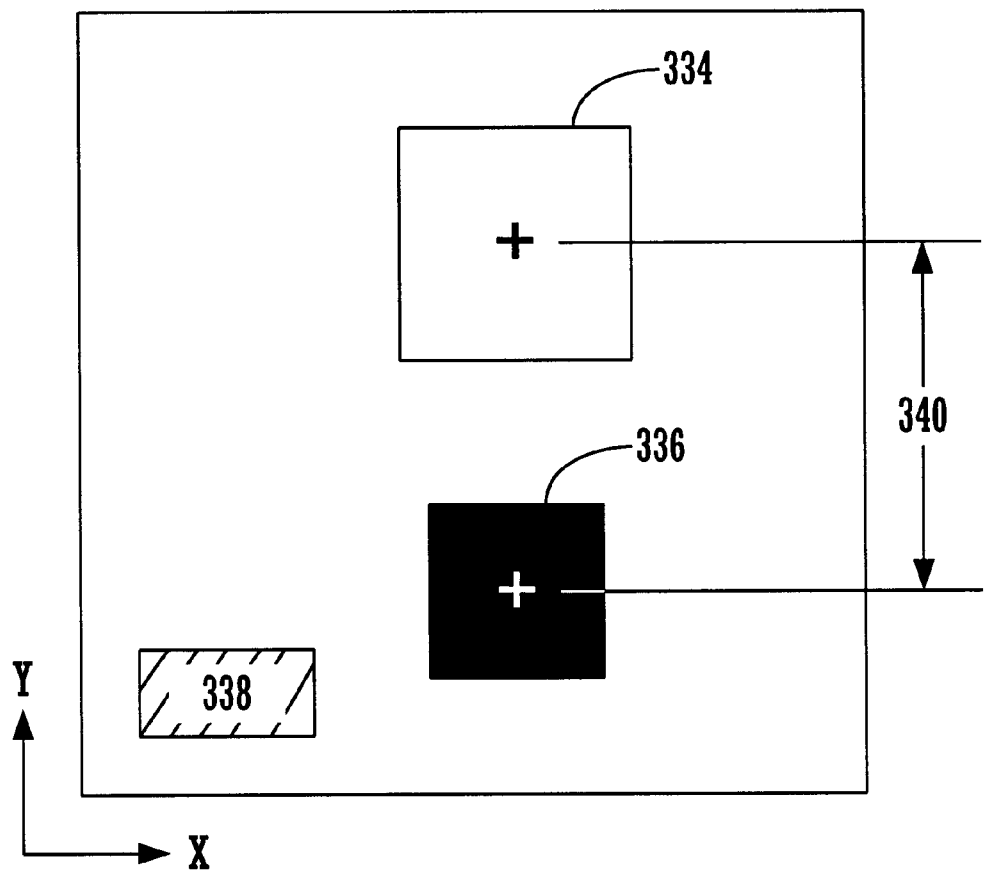
FIG. 3B is a top view of a pattern box portion of an alignment reticle, in accordance with one embodiment of the present invention.

Referring now to FIG. 3B, a first configuration of a pattern box in an alignment reticle is shown, in accordance with one embodiment of the present invention. In FIG. 3B, pattern box in center portion 333 of alignment reticle 300 includes a first pattern and a second pattern. In the present embodiment, first pattern includes a large overlay box 334 and a fine alignment target 338. Second pattern includes a small overlay box 336. Large overlay box 334 is offset from small overlay box 336 by distance 340. This distance can vary depending upon the application. While the present embodiment shows specific location and dimensions for large overlay box 334, small overlay box 336, and fine alignment target 338, the present invention is suitable to a wide variety of sizes and locations for these components within center portion 333 of reticle 300. The present embodiment shows large overlay box 334 as white, and small overlay box 336 as dark for photosensitivity purposes. However, the present embodiment is suitable to switching the photosensitive configurations of the overlay boxes. The following figure provides an alternative embodiment. The pattern box configuration shown in FIG. 3B can be used in any of the patterned boxes A1–E5 shown in FIG. 3A. However, the fine alignment target 338 is not included in any of the pattern boxes except the one located in central portion 333 of alignment reticle, e.g. pattern box C3, in another embodiment.

Figure 3C:
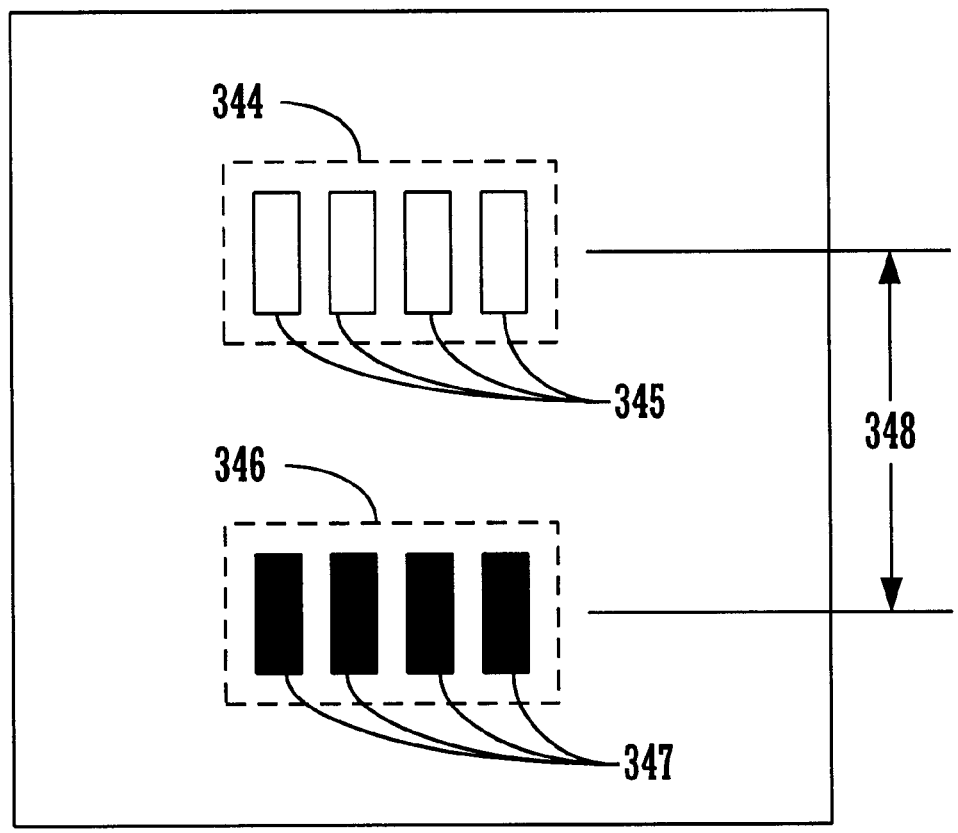
FIG. 3C is a top view of a second configuration of a pattern box portion of an alignment reticle, in accordance with one embodiment of the present invention.

Referring now to FIG. 3C, a second configuration of a pattern box in an alignment reticle is shown, in accordance with one embodiment of the present invention. In FIG. 3C, patterned box in center portion 333 of reticle 300 includes a first pattern 344 and a second pattern 346. In the present embodiment, first pattern.344 includes multiple large overlay boxes 345. Similarly, second pattern 346 of the present embodiment includes multiple small overlay boxes 347. Small overlay boxes 347 or large overlay boxes 345 can also be adapted for use as fine alignment targets for aligning the wafer in the stepper for a translational misalignment measurement. Thus, the fine alignment target has essentially no error from lens aberration, e.g. magnification error, from rotational misalignment, from reticle writing error, or from translational misalignment. Consequently, this embodiment isolates the true translational misalignment error between the reticle and the wafer because one of the overlay boxes actually is the alignment target.

While the present embodiment shows three of each kind of overlay box, e.g. for 345 and 347, the present invention is well-suited to using any quantity of small overlay boxes for fine alignment targets, or to using any quantity of large overlay boxes for fine alignment targets. The present invention is also well-suited to a wide variety of sizes and locations of overlay boxes within center portion 333 of alignment reticle. Additionally, the present invention is also well-suited to adapting a center portion 333 of a product reticle for fine alignment target and overlay boxes. In this embodiment, the center portion of the reticle can be projected onto an area between dies, e.g. in the scribe line, on a product wafer. This alternative, applicable to a reticle covering more than one die, provides translation error measurement capabilities without interfering with the product wafer dies.

Using fine alignment target for overlay box is described in greater detail in co-pending U.S. patent application Ser. No. 09/425,834, concurrently filed herewith, entitled "Method for Determining Wafer Misalignment Using a Pattern on a Fine Alignment Target," by Pierre Leroux, and assigned to the assignee of the present invention.

While the embodiment shown in FIG. 3C is provided as the pattern box configuration for center portion 333 of alignment reticle 300, this pattern box configuration is also well-suited for use in any other pattern box, e.g. A1–E5, shown in FIG. 3A. When used as a pattern box other than for center region 333 of alignment reticle, the overlay boxes 345 and 347 can be used simply as overlay boxes, rather than as a fine alignment target.

Figure 4A:
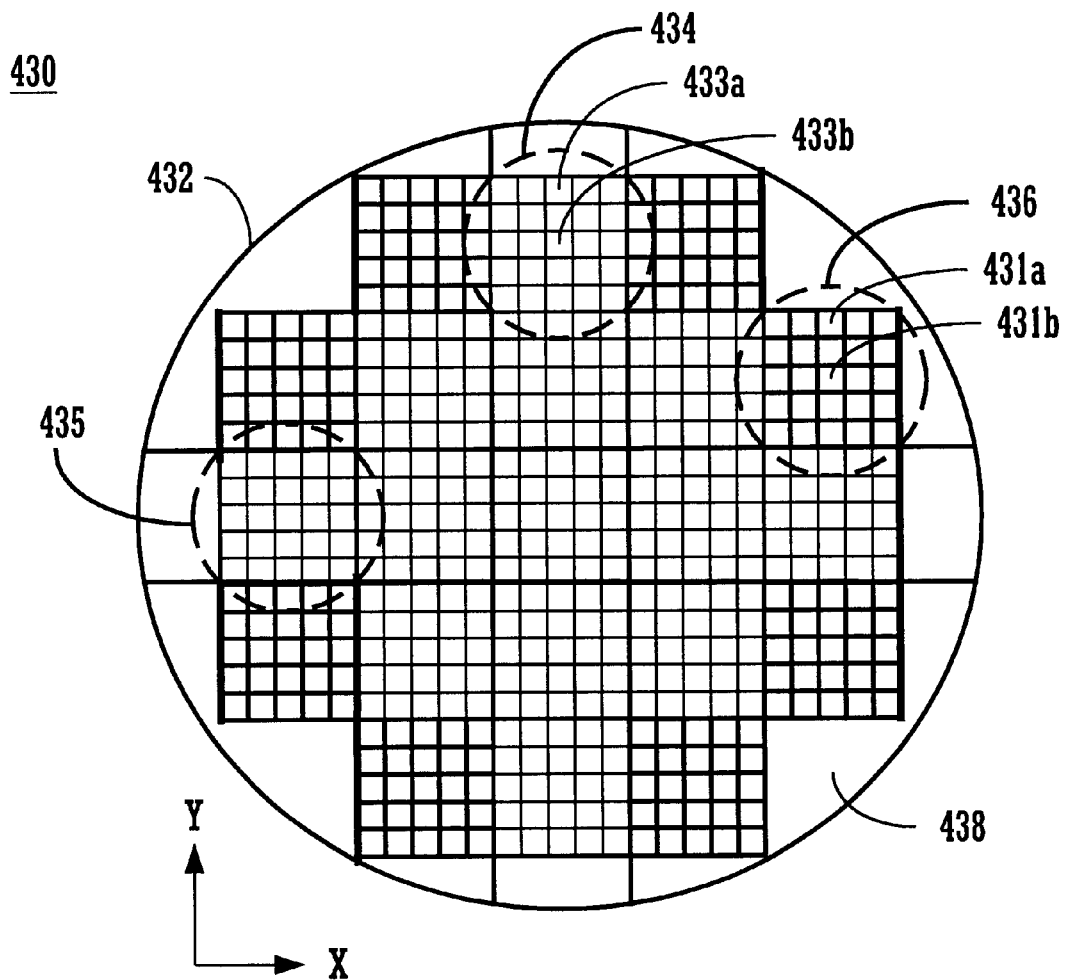
FIG. 4A is a top view of a wafer with several shots having patterns created therein is shown, in accordance with one embodiment of the present invention.

Referring now to FIG. 4A, a wafer with several shots having patterns created therein is shown, in accordance with one embodiment of the present invention. Wafer 430 is located in an X-Y plane as shown in a top view of FIG. 4A. In one embodiment, wafer 430 is a PM wafer that can be used for a periodic preventative maintenance alignment check on a stepper. In one embodiment, wafer 430, as shown in FIG. 4A, is the silicon substrate with images etched therein. Alternatively, the images shown in FIG. 4A can be made in a layer of material located above the silicon substrate. In another embodiment, FIG. 4A represents several layers of material, each of which have images formed therein. The grid of pattern boxes shown in FIG. 4A does not include details of the finer patterns located within the pattern boxes, e.g. 433a, for purposes of clarity. This detail will be shown in subsequent figures and described hereinafter, with reference to the present and previous figures.

While FIG. 4A shows a wafer with a given quantity and layout of shots, the present invention is well-suited to using any quantity and layout of shots on a wafer. The grid layout for each shot represents a grid, or matrix, of pattern boxes that will be formed thereon. The grid appearance of each shot on the wafer corresponds to a grid appearance of a reticle, e.g. dashed line grid on reticle of FIG. 3A.

Wafer 430 is sectioned into multiple peripheral shots, e.g. 436, into multiple internal shots, e.g. shot 434, and multiple cutoff areas, e.g. area 438. Peripheral shots, e.g. shot 436, are uncropped shots, in the shape of a square, that touch the outside diameter 432 of wafer 430. Internal areas, e.g. shot 434, are uncropped shots, in the shape of a square, that do not touch outside diameter 432 of wafer 430. Cutoff areas, e.g. cutoff area 438, are areas that do not have a complete shot, or square shape, on wafer 430. Peripheral shots are shown as darker lines than internal shots for purposes of clarity and distinction. In one embodiment, a shot is defined as the area on the wafer upon which a reticle image is projected and formed. In another embodiment, a reticle image can have images that can cover several shots. The present invention is well-suited to shots having a wide range of shapes and configurations.

Figure 4B:
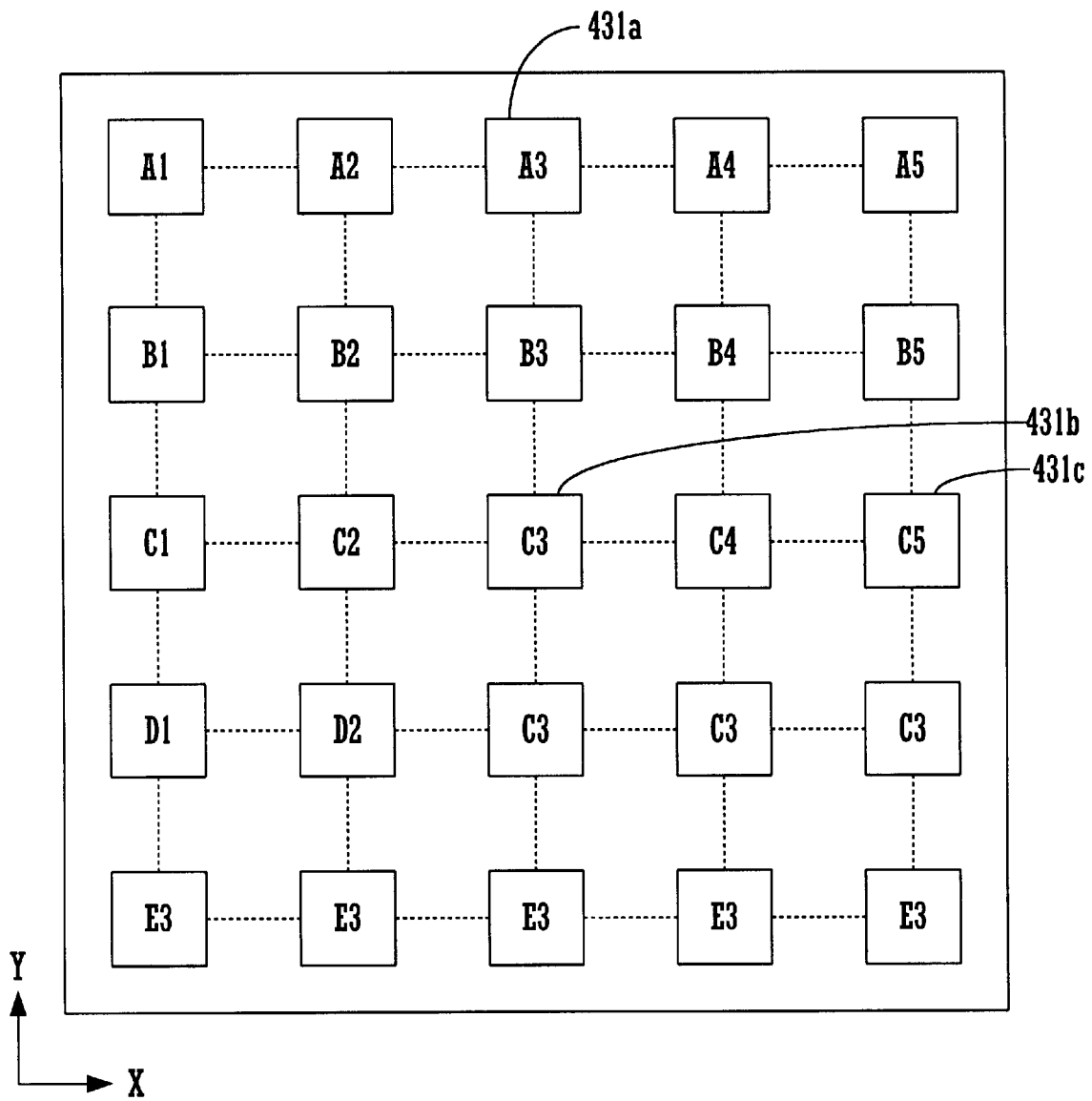
FIG. 4B is a top view of one shot with alignment overlays on one layer of a wafer, in accordance with one embodiment of the present invention.

Referring now to FIG. 4B, one shot of alignment overlays in one layer of a wafer is shown, in accordance with one embodiment of the present invention. FIG. 4B shows the identity of the pattern boxes, e.g. pattern box A3 431, for a peripheral shot, e.g. shot 436. For purposes of clarity, pattern detail within each box, e.g. 431, and between boxes, is not shown in FIG. 4B. The shot shown is referred to as a "full-field" shot because the full field of a reticle, e.g. alignment reticle 300 of FIG. 3A, is projected to wafer in a single exposure of the reticle. Consequently, an outer portion of a reticle, e.g. pattern box A3 331 of FIG. 3A, is projected through an outer portion of a lens, e.g. region 208b of lens 208 of FIG. 2, onto an outer portion of a shot, e.g. to form A3 431 of FIG. 4B, on a wafer. Similarly, an inner portion of a reticle, e.g. pattern box C3 333 of FIG. 3A, is projected through a center portion of a lens, e.g. region 208a of lens 208 of FIG. 2, onto a center portion of a shot, e.g. to form A3 431 of FIG. 4B, on a wafer. An imaginary grid of dashed lines is shown to provide reference to the matrix grid of shots, as shown in FIG. 4A.

In one embodiment of FIGS. 4A and 4B, full-field shot 436 is formed in only one peripheral shot locations, e.g. 436, of FIG. 4A. In another embodiment, the full-field shot is formed in all peripheral shot locations, e.g. the thick-lined grid locations of wafer 430. By forming full-field shots in multiple locations on a wafer, multiple alignment checks can be performed. Consequently, measurement noise can be reduced by averaging the results. In another embodiment, no full-field shots are used for a PM wafer. In one embodiment, the shot shown in FIG. 4B is formed in the silicon substrate. In another embodiment, the shot shown in FIG. 4B is formed in a layer of material formed on the wafer substrate of the wafer. In one embodiment, each of the pattern boxes shown can have either a pattern similar to that shown in FIG. 3B or in FIG. 3C, or any other pattern. In one embodiment, only a center box, e.g. 433c of FIG. 4B has a pattern that includes an alignment target, such as that shown in prior art FIG. 3B. In another embodiment, the center pattern box does not need an alignment target for a full-field shot.

Figure 4C:
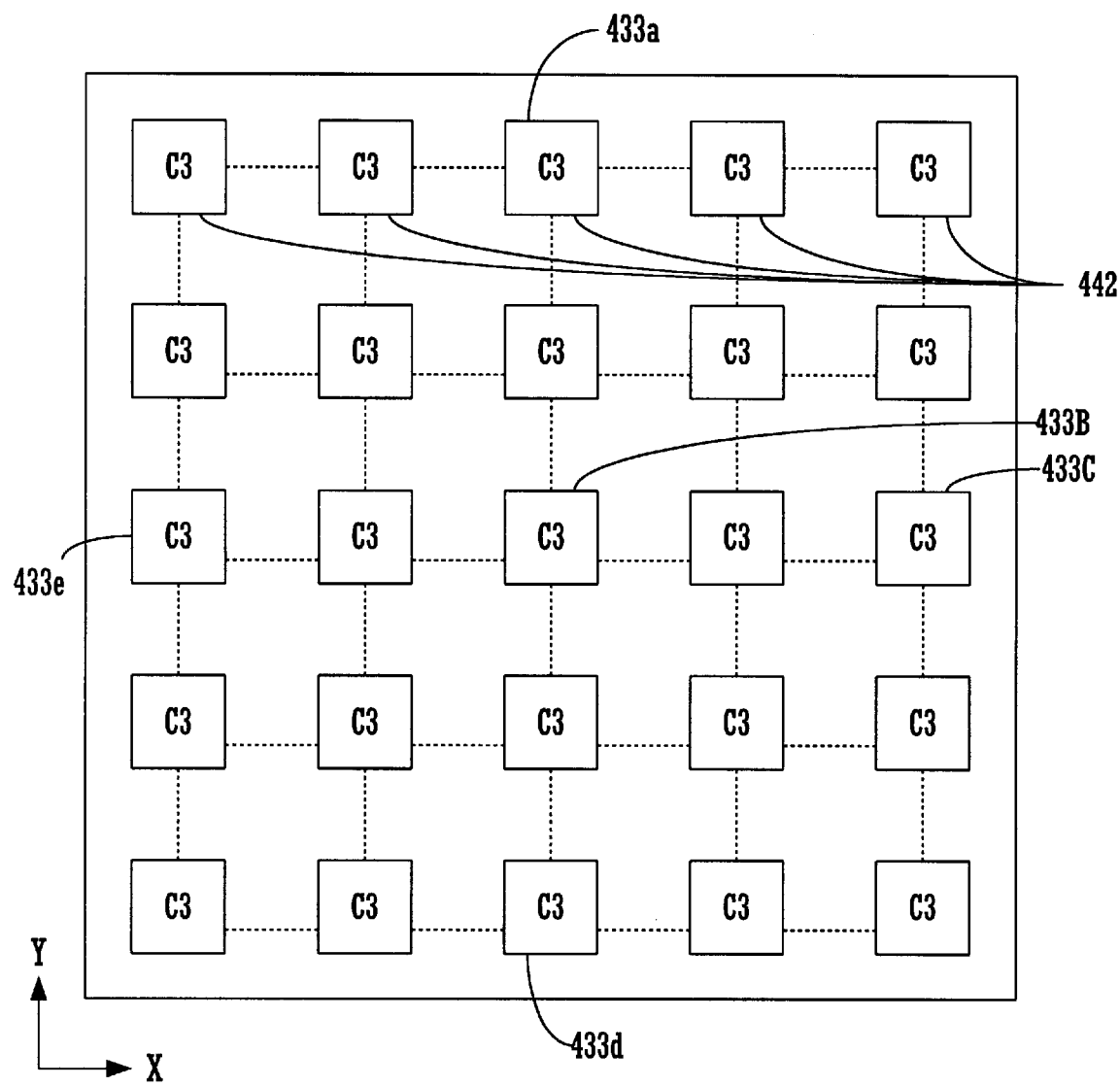
FIG. 4C is a top view of another shot with alternative alignment overlays on one layer of a wafer, in accordance with one embodiment of the present invention.

Referring now to FIG. 4C, another shot with alternative alignment overlays in one layer of a wafer is shown, in accordance with one embodiment of the present invention. FIG. 4C shows the identity of the pattern boxes, e.g. pattern box C3 433a, for an internal shot, e.g. shot 434. For purposes of clarity, pattern detail within each box, e.g. pattern box C3 433a, and between the pattern boxes, is not shown in FIG. 4C. The shot shown is referred to as a repeated pattern of a "bladed-down" shot. This term arises because only a small portion of the field of a reticle, e.g. alignment reticle 300 of FIG. 3A, is exposed to form each pattern box on the shot, e.g. shot 434. By repeating this process, the pattern shown is developed. That is, only a center portion of a reticle, e.g. pattern box C3 333 of FIG. 3A, is projected through an center portion of a lens, e.g. region 208a of lens 208 of FIG. 2, onto a region of a shot on a wafer, e.g. to form pattern box C3 431 of FIG. 4B. To create a row of C3 pattern boxes, e.g. pattern boxes 442, the reticle or the wafer has to be indexed and the center portion of the reticle is re-projected through the center portion of the lens onto a different region of a shot on the wafer. Likewise, the reticle or wafer is indexed to form columns of pattern boxes. This process is repeated to fill the entire shot with C3 pattern boxes.

In one embodiment FIG. 4C, bladed-down shot 434 is formed in only one internal shot location, e.g. 434, of FIG. 4A. In another embodiment, the bladed-down shot is formed in all internal shot locations, e.g. the thin-lined grid locations of wafer 430. By forming bladed-down shots in multiple locations on a wafer, multiple measurement checks can be performed. Consequently, measurement noise can be reduced by averaging the results. In one embodiment, the shot shown in FIG. 4C is formed in the silicon substrate. In another embodiment, the shot shown in FIG. 4C is formed in a layer of material formed on the wafer substrate. In one embodiment, shot shown in FIG. 4C is formed in the same layer as shot from FIG. 4B. In another embodiment, shots of FIG. 4B and FIG. 4C are formed in different layers of material on a wafer. In one embodiment, each of the pattern boxes shown can have either a pattern similar to that shown in FIG. 3B or in FIG. 3C. In one embodiment, only a center box, e.g. 433c of FIG. 4B has a pattern that includes an alignment target, such as that shown in prior art FIG. 3B. In another embodiment, the center pattern box does not need an alignment target.

Figure 4D:
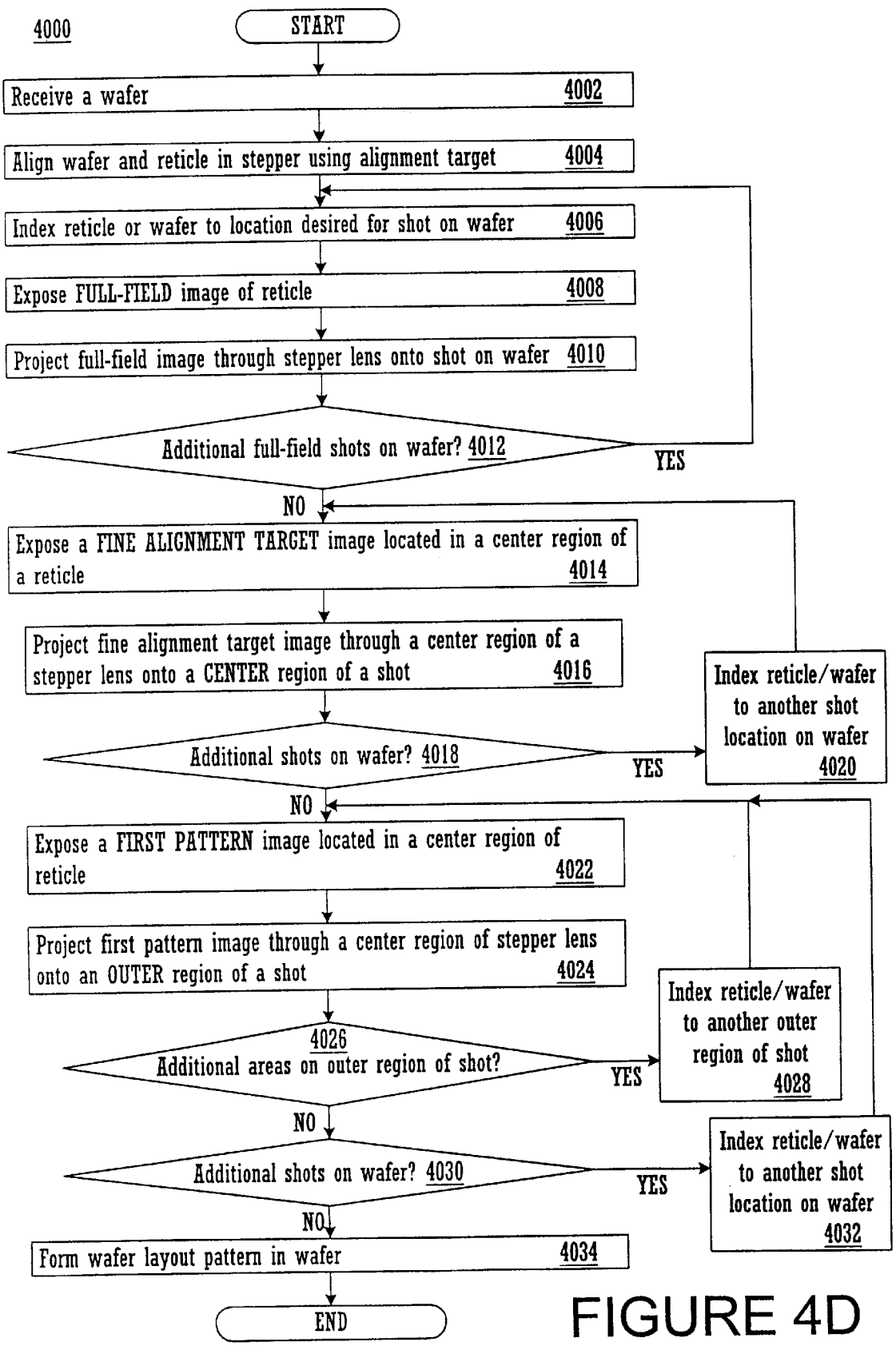
FIG. 4D is a flowchart of the steps performed to create a Preventative Maintenance (PM) wafer for measuring rotational error, in accordance with one embodiment of the present invention.

Referring now to FIG. 4D, a flowchart 4000 of the steps performed to create a Preventative Maintenance (PM) wafer for measuring rotational error is shown, in accordance with one embodiment of the present invention. By using the flowchart embodiment, the present invention provides a PM wafer that isolates, and allows a very precise measurement of rotational error of the stepper. While the present invention utilizes flowchart 4000 for a PM wafer in a stepper machine, the present invention is well-suited to adapting the method of the present invention for other types of wafers in other types of devices needing wafer alignment.

In one embodiment the steps of flowchart 4000 can be thought of as creating an error-free alignment pattern within the wafer, over which alignment patterns with rotational error will be placed. By comparing the two sets of patterns, the present invention provides a method by which rotational error can be isolated.

Flowchart 4000 begins with step 4002. In step 4002 of the present embodiment, a wafer is received. Step 4002 is implemented, in one embodiment, with wafer 430 of FIG. 4A through 4C, but without any PM patterns formed therein. That is, only the coarse alignment marks and/or scribe lines exist in the wafer in the present embodiment. In one embodiment, the wafer received includes only a silicon substrate, into which patterns will be formed. This embodiment is chosen because the silicon layer is very durable and can be reused for repetitious preventative maintenance checks on a stepper. Additionally, the silicon layer is very stable. That is, it does not warp from the presence of layers of dissimilar materials, such as metal, that have different properties, such as different thermal coefficients of expansion from that of silicon. In another embodiment, a layer does exist on the silicon substrate. The layer in this latter embodiment will have the subsequent patterns formed therein. Following step 4002, flowchart 4000 proceeds to step 4004.

In step 4004 of the present embodiment, the wafer and reticle are aligned with each other in the stepper. FIG. 2 shows on embodiment of the present step 4004. In FIG. 2, wafer 213 and reticle 206 are aligned with each other in stepper 200a. This step uses well-known methods and apparatus to align the wafer. Following step 4004, flowchart 4000 proceeds to step 4006.

In step 4006 of the present embodiment, the reticle or wafer is indexed to the location desired for a shot. FIG. 2 shows on embodiment of the present step 4006. In FIG. 2, either wafer 213 or reticle 206 can be indexed in stepper 200a to the desired location for a shot. Step 4006 is implemented in another embodiment as shown in FIG. 4A, where wafer or reticle can be indexed to any of the internal shots, e.g. shot 434, or external shots, e.g. shot 436, as desired. This step uses well-known methods and apparatus to index the wafer or reticle. Following step 4006, flowchart 4000 proceeds to step 4008.

In step 4008 of the present embodiment, a full-field image of a reticle is exposed. Several embodiments implementing Step 4008 are shown in FIG. 2 and in FIGS. 3A through 3C. Specifically, step 4008 can be implemented by exposing a full field of reticle 206 shown in FIG. 2. Fullfield includes the full field of view of the reticle, e.g. including center portion 206a and outer portion 206b of reticle 206. Several embodiments of a reticle are shown in FIG. 3A through 3C. In the embodiment shown in FIG. 3A, the entire reticle 300, e.g. pattern boxes A1–E5, is exposed in step 4008. While the embodiments shown have a specific layout and geometry, the present invention is well-suited to using any reticle, including an alignment reticle or a product reticle. The purpose of exposing a full-field reticle is to form the full pattern of the reticle onto a wafer, as described in subsequent steps, for evaluation of alignment. In another embodiment, step 4008 is not used in the method to form a PM reticle. Following step 4008, flowchart 4000 proceeds to step 4010.

In step 4010 of the present embodiment, the full-field image is projected through the full-field of a stepper lens onto a shot. Step 4010 is implemented in FIG. 2, which shows the full-field of the stepper lens as 209, e.g. including center portion 208a and outer portion 208b. Step 4010 is also implemented in FIG. 4A, where the full-field shot could be peripheral shot 436. FIG. 4B shows an embodiment where a full-field shot has repeated a pattern of pattern boxes, e.g. A1–E5 in a peripheral shot 436 on a wafer. The pattern boxes A1–E5 in shot 436 of FIG. 4B correspond directly to the pattern boxes A1–E5 on the reticle, 300 of FIG. 3A. Following step 4010, flowchart 4000 proceeds to step 4012.

In step 4012 of the present embodiment, an inquiry determines whether additional full-field shots are desired on the wafer. In one embodiment, only one full-field shot is exposed and projected onto a wafer, although the present invention can include multiple shots. Additionally, one embodiment only projects the full-field image onto a peripheral shot location of a wafer, e.g. peripheral shot 436 of FIG. 4A. However, the present invention is well-suited to projecting the full-field image to any shot location on a wafer. If additional shots are desired on the wafer, then flowchart 4000 returns to step 4006. However, if additional shots are not desired on the wafer, then flowchart 4000 proceeds to step 4014.

Step 4014 arises if additional full-field shots are not desired on the wafer, per step 4012. In step 4014 of the present embodiment, a fine alignment target image located in a center region of a reticle is exposed. Several embodiments implementing Step 4014 are shown in FIG. 2 and in FIGS. 3A through 3C. Specifically, step 4014 an be implemented by exposing a center region 206a of reticle 206 as shown in FIG. 2. Several embodiments of a reticle are shown in FIGS. 3A through 3C. In the embodiment shown in FIG. 3A, center portion of reticle 300 includes pattern box C3 333. FIGS. 3B and 3C provide several embodiments of the fine alignment target located within pattern box C3 333. In one embodiment, the pattern box located in the center portion of the reticle includes a overlay boxes 334 and 336 in addition to a fine alignment target 338. In another embodiment, the large overlay boxes 345 and small overlay boxes 347 can be utilized as a fine alignment target as well as an overlay for misalignment measurement. The discussion presented for FIGS. 3B and 3C, hereinabove, provide additional information on the configuration of the fine alignment targets contained therein. While the embodiments shown have a specific layout and geometry, the present invention is well-suited to using any reticle, including an alignment reticle or a product reticle.

Regarding step 4014, the purpose of only exposing a center portion of a reticle is to provide a nearly error-free fine alignment target onto a wafer, as described in subsequent steps. The center portion of the reticle is nearly error-free for reasons discussed in FIGS. 3A through 3C, hereinabove. Following step 4014, flowchart 4000 proceeds to step 4016.

In step 4016 of the present embodiment, the fine alignment target is projected through a center region of a stepper lens onto a center region of a shot. Step 4016 is implemented, in one embodiment, in FIGS. 4A through 4C. Specifically, Step 4016 is implemented in FIG. 2, which shows the center portion 208a of the stepper lens 208. Step 4016 is also implemented in FIG. 4A, where the image can be projected on a center region of a shot, not previously exposed. By using the center region of the stepper lens for this step, the present invention reduces any error arising from magnification error or rotation error for the first pattern that is created in the wafer. approximately error-free first pattern. This conclusion arises because magnification error is typically at a minimum at the center of the lens, where almost no magnification occurs. Similarly, circumferential, or rotational, offset 6 increases, approximately linearly, with the distance from the center, e.g. radius R, of a shot, for a given rotation error θ, e.g. δ=R*θ. Consequently, the minimum rotation error occurs at the center of the lens and reticle and shot. In one embodiment, the image formed from step 4016 will be used in a subsequent flowchart for determining translation error for the stepper that will be removed prior to determining a rotational error portion of the total misalignment error. This discussion will be discussed in that subsequent flowchart. Following step 4016, flowchart 4000 proceeds to step 4018.

In step 4018 of the present embodiment, an inquiry determines whether additional shots are desired on the wafer. If additional shots are desired on the wafer, then flowchart 4000 proceeds to step 4020. However, if additional shots are not desired on the wafer, then flowchart 4000 proceeds to step 4022.

Step 4020 arises if additional shots are desired on the wafer, per step 4018. In step 4020 of the present embodiment, the reticle or the wafer is indexed to another shot location on the wafer. In this manner, the shots do not overlay each other for the embodiment presented for flowchart 4000. Step 4020 is implemented, in one embodiment, in FIG. 4A. In FIG. 4A, either the reticle or the wafer is indexed to move from a center region of one shot to a center region of another shot. For example, wafer or reticle could be indexed from interior shot 434 down in the Y direction to the shot immediately below it for another shot. However, the indexing can be for a wide range of distances in one or more directions.

In one embodiment, steps 4014–4020 are not required so long as steps 4006–4012 were used to form a full-field image on at least shot on the wafer. The rationale for this latter embodiment relies on step 4008 and 4010 to intrinsically project a center portion of reticle through a center portion of a lens onto a center portion of a shot during the full-field shot. In another embodiment, FIG. 4A shows that all internal shots, e.g. internal shot 434, have an image projected onto the center portion of each shot, e.g. 433b. While only internal shots of the present embodiment have the center region of reticle projected onto it, the present invention could likewise implement step 4016 on peripheral shots, if they were not utilized by previous steps for projecting full-field images. Following step 4020, flowchart 4000 returns to step 4014.

Step 4022 arises if no additional shots are desired on the wafer, per step 4018. In step 4022 of the present embodiment, a first pattern image located in a center region of a reticle is exposed. Step 4022 is implemented in a similar manner as step 4014, in one embodiment. First pattern can be either overlay boxes separate from fine alignment target, as shown in the reticle of FIG. 3B. Alternatively, first pattern can be a overlay boxes, e.g. 345 or 347, that are also used as a fine alignment target. The latter embodiment has the effect of projecting, and subsequently forming, duplicative fine alignment targets, although they are not utilized specifically as a fine alignment target in this embodiment. Rather, the duplicative fine alignment targets are utilized for determining the rotational portion of total misalignment error. Following step 4022, flowchart 4000 proceeds to step 4024.

In step 4024 of the present embodiment, the first pattern image from step 4022 is projected through a center region of a stepper lens onto an outer region of a shot. Step 4024 is implemented, in one embodiment, in FIG. 4A and 4C. In particular, one embodiment projects the first pattern onto an outer region of a shot, e.g. to form pattern box C3 443 of FIG. 4C. Outer location in this embodiment, is defined as any location outside of a center region, e.g. location 433b, of a shot. The benefits of using the center part of the reticle in step 4022 and using the center part of the stepper lens in step 4024 is to provide an approximately error-free first pattern. This conclusion arises because magnification error is typically at a minimum at the center of the lens, where almost no magnification occurs. Similarly, circumferential, or rotational, offset δ increases, approximately linearly, with the distance from the center, e.g. radius R, of a shot, for a given rotation error θ, e.g. δ=R*θ. Consequently, the minimum rotation error occurs at the center of the lens and reticle and shot. Following step 4024, flowchart 4000 proceeds to step 4026.

In step 4026 of the present embodiment, an inquiry determines whether the first pattern image is to be projected onto additional outer regions of a shot on the wafer. Step 4026 is implemented, in one embodiment, in FIGS. 4A through 4C. If it is desired to project the first pattern image onto additional outer regions of a shot on the wafer, then flowchart 4000 proceeds to step 4028. However, if it is not desired to project the first pattern image onto additional outer regions of a shot on the wafer, then flowchart 4000 proceeds to step 4030.

Step 4028 arises if additional shots are desired on the wafer, per step 4026. In step 4028 of the present embodiment, the reticle or the wafer is indexed to another region of a given shot location on the wafer. Step 4028 is implemented, in one embodiment, in FIG. 2 and FIGS. 4A and 4C. Specifically, FIG. 2 shows that stage 212 holding wafer 213 can be moved in any of multiple directions, e.g. X direction 212a, as desired. Alternatively, reticle 206 can be indexed to another location if desired. Thus, it multiple projections, e.g. C3 433a, and c–e, of a first pattern are desired on a shot, e.g. 434, as shown in FIG. 4C, then indexing can occur to repeat the projection of the given first pattern onto the shot of the wafer. In one embodiment, steps 4022 through 4028 are repeated until pattern boxes are formed in all regions of a shot, e.g. such as shot 434 shown in FIG. 4C. In one embodiment, the grid of pattern boxes formed by steps 4022 through 4028 correspond to a location of pattern boxes formed by a full-field exposure of a reticle, e.g. reticle 300 of FIG. 3A. In another embodiment, only a single C3 location, e.g. pattern box C3 433a, is made on a shot. This latter embodiment provides sufficient information to obtain rotational error, or rotational misalignment. However, alternative embodiments provide additional benefits. Yet in another embodiment, four regions, e.g. for pattern boxes 433a, 433c–433e, of a shot, e.g. shot 434, are chosen to receive the projection of a first pattern, as shown in FIG. 4C. The four outer regions chosen provide the greatest distance from the center of the lens and thus, in one embodiment, provide a worst case manifestation of rotational error for a shot. By using multiple projections of first pattern on a shot, the present embodiment can reduce noise in the measurement and fabrication operations by averaging the results of the alignment process on the multiple images. Following step 4028, flowchart 4000 returns to step 4022.

In step 4030 of the present embodiment, an inquiry determines whether additional shots are desired on the wafer. Step 4030 is implemented, in one embodiment, in FIG. 6. If additional shots are desired on the wafer, then flowchart 4000 proceeds to step 4032. However, if additional shots are not desired on the wafer, then flowchart 4000 proceeds to step 4034.

Step 4032 arises if additional shots are desired on the wafer, per step 4030. In step 4032 of the present embodiment, the reticle or the wafer is indexed to another shot location on the wafer. FIG. 2 shows that stage 212 holding wafer 213 can be moved in any of multiple directions, e.g. X direction 212a, if desired. Alternatively, reticle 206 can be indexed to another location as desired. Thus, if multiple shots, e.g. shot 434 and 435 as shown in FIG. 4C, are desired, then indexing can occur to repeat steps 4022 through 4028 for a new shot on wafer 430.

In one embodiment, steps 4022 through 4032 are repeated until all internal shots desired are created. In one embodiment, only a single shot with a first pattern is formed in an outer region of the shot. Yet in another embodiment, all internal shots, e.g. shot 434, are chosen to receive the projection of a first pattern in outer regions of the shot, as shown in FIG. 4A. By using multiple shots, the present embodiment can reduce noise in the measurement and fabrication operations by averaging the results of the alignment process on the multiple images. Following step 4032, flowchart 4000 returns to step 4022.

Step 4034 arises if additional shots are not desired on the wafer, per step 4030. In step 4034 of the present embodiment, the layout pattern is formed in the wafer. Step 4034 is implemented, in one embodiment, in FIG. 4A through 4C. Specifically, the images projected onto the wafer from steps 4010, 4016, and 4024, are now formed into shapes, e.g. as shown in subsequent figures. This is accomplished using well-known techniques in wafer and semiconductor fabrication such as etching and chemical-mechanical polishing. Thus, in one embodiment, the present invention will form a PM wafer with a nearly error-free alignment pattern that can be used repeatedly for subsequent alignment operations. More specifically, the nearly error-free alignment pattern is essentially free from errors due to magnification and rotation. Translation error will be accounted for in a subsequent embodiment. Following step 4034, flowchart 4000 ends.

While flowchart 4000 of the present embodiment shows a specific sequence and quantity of steps, the present invention is suitable to alternative embodiments. For example, not all the steps provided for flowchart 4000 are required for the present invention. And additional steps may be added to those presented. Likewise, the sequence of the steps can be modified depending upon the application. Furthermore, while flowchart 400 is shown as a single serial process, it can also be implemented as a continuous or parallel process. Many of the instructions for the steps, and the data input and output from the steps, of flowchart 4000 utilize memory and utilize controller hardware shown in a subsequent figure.

Figure 5A:
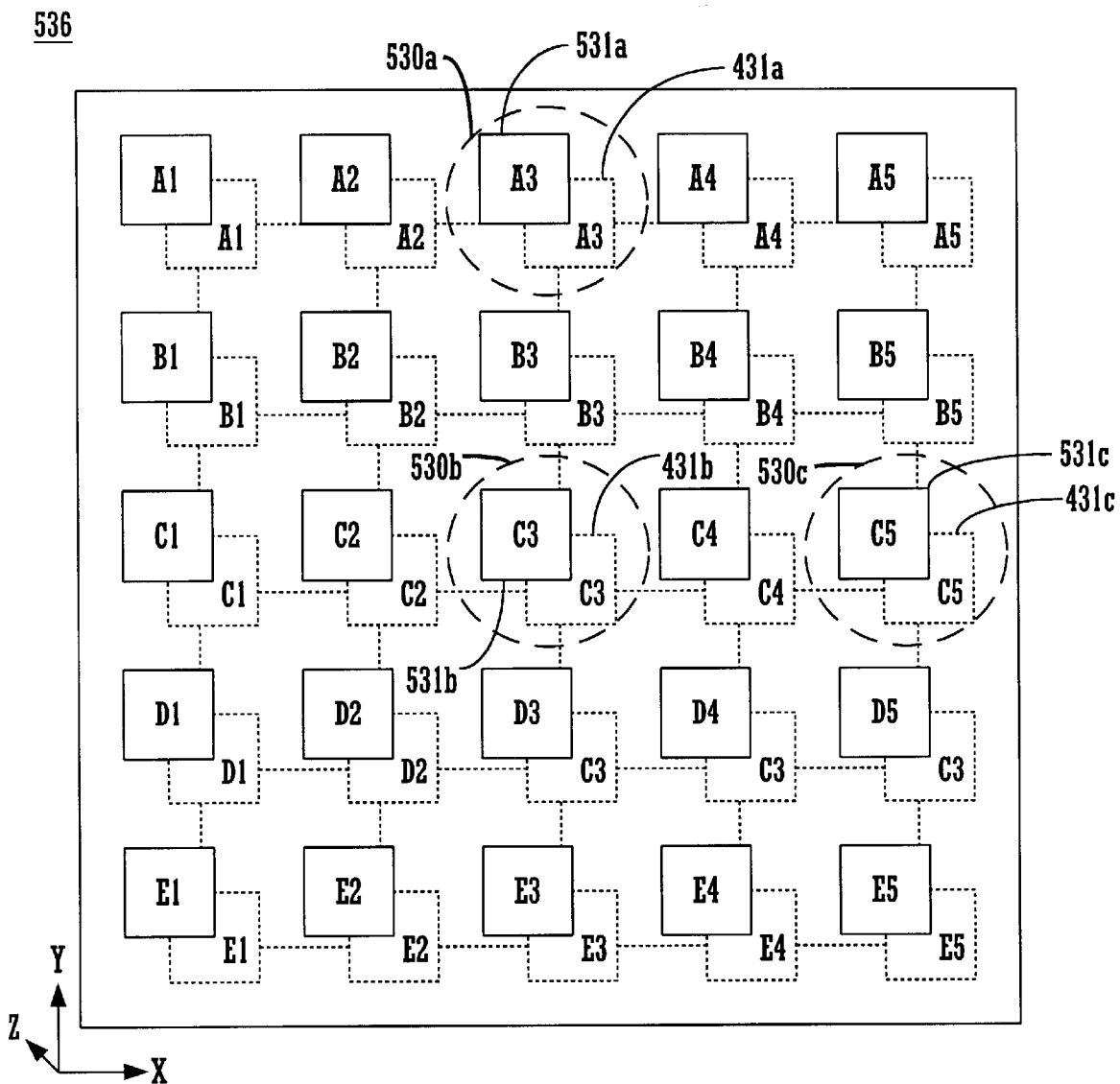
FIG. 5A is a top view of one shot with alignment overlays on two layers of a wafer, in accordance with one embodiment of the present invention.

Referring now to FIG. 5A, a top view of one shot with alignment overlays in two layers of a wafer is shown, in accordance with one embodiment of the present invention. Shot 536 of FIG. 5A shows two layers of patterns, offset from each other for clarity. In the present embodiment, the two layers of pattern boxes should almost directly overlay each other. The first set of patterns is formed in the silicon substrate of the wafer, in one embodiment, per flowchart 4000. This set of pattern boxes is shown in dashed lines for clarity. In contrast, the solid lined pattern boxes are formed in a layer of material located above the silicon substrate of the wafer, in one embodiment. In one embodiment, the material of the second layer is a photo-resistive material that can easily be formed and removed from the wafer without harming the pattern formed in the silicon substrate.

In one embodiment, shot 500c represents a typical layout for patterns formed in two layers of a wafer. Shot 500c represents a peripheral shot, e.g. corresponding to shot 436 of FIG. 4A, where both the first layer pattern and the second layer pattern to be formed as described in flowchart 5000, hereinafter, are full-field patterns. Hence, each pattern box that overlays each other is of the same type. For example, pattern A3 431 formed in silicon substrate, as shown in FIG. 5A, is overlaid with the same pattern, e.g. A3 531 formed in material layer above silicon substrate. Similarly, a pattern C5 431c formed in silicon substrate, as shown in FIG. 5A, is overlaid with the same pattern, e.g. C5 531c formed in material layer above silicon substrate. A view of the two layers is shown in subsequent FIGS. 5C and 5D, as a top view and side view, respectively. Because each of the layers has the same full-field image formed therein, the various errors in the wafer fabrication process are present, in appropriate degrees, for respective overlaying pattern boxes in each layer. For example, a pattern box located in an outer region of a shot will have a greater rotational error, in general, then a pattern box located in a center region of a shot. Similarly, a pattern box in one area of a lens may suffer a greater distortion than a pattern box in a different area of the lens, though they are the same radius from the center of the lens.

Figure 5B:
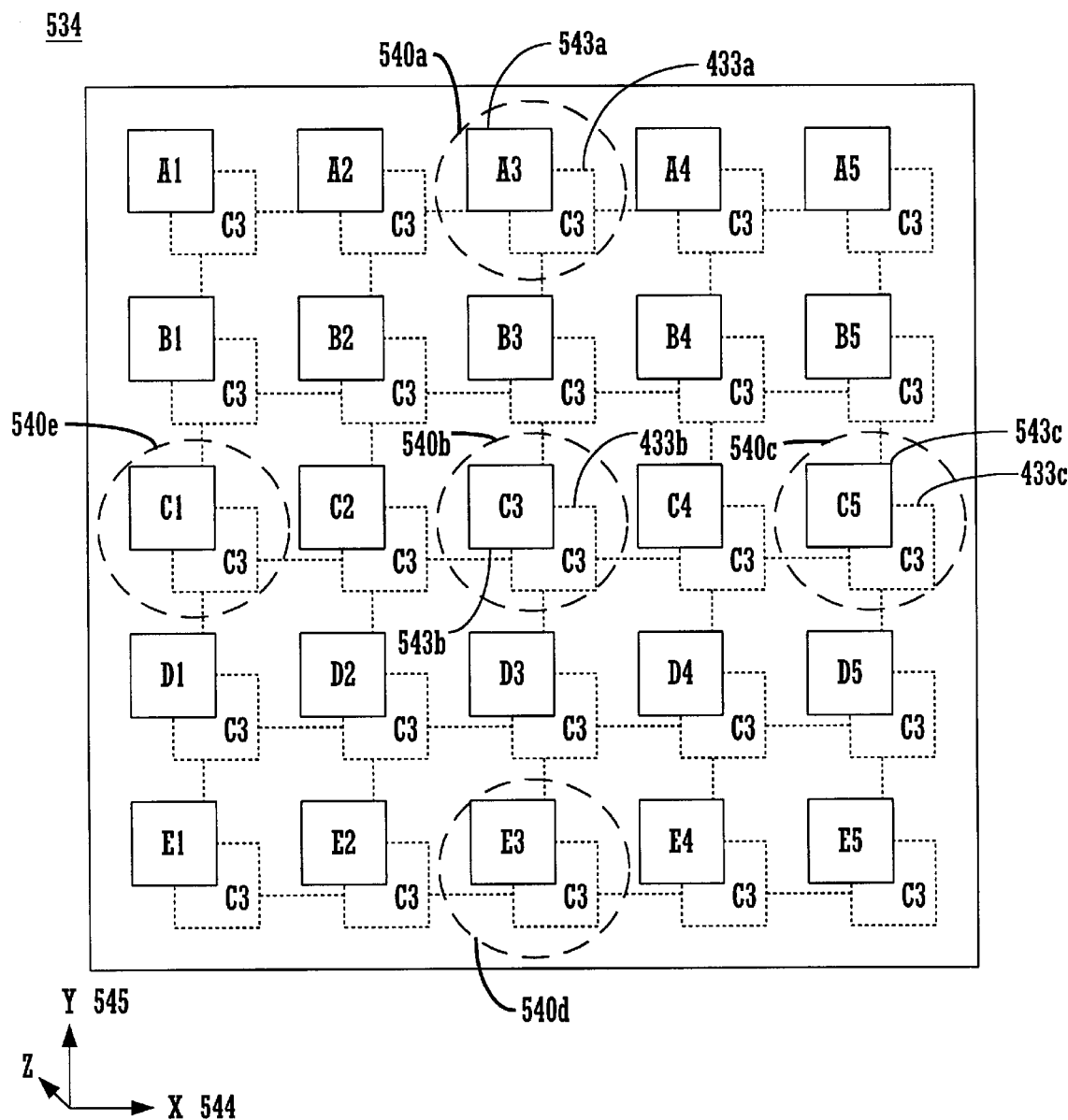
FIG. 5B is a top view of another shot with alternative alignment overlays on two layers of a wafer, in accordance with one embodiment of the present invention.

Referring now to FIG. 5B, a top view of another shot with alternative alignment overlays in two layers of a wafer is shown, in accordance with one embodiment of the present invention. Shot 534 of FIG. 5B shows two layers of patterns, offset from each other for clarity. In the present embodiment, the two layers of pattern boxes should almost directly overlay each other. The first set of patterns is formed in the silicon substrate of the wafer, in one embodiment, per flowchart 4000. This set of pattern boxes is shown in dashed lines for clarity. In contrast, the solid lined pattern boxes are formed in a layer of material located above the silicon substrate of the wafer, in one embodiment. In the present embodiment, the material of the second layer is a photo-resistive material that can be easily formed and removed from the wafer without damaging the pattern formed in the silicon substrate. The solid lined pattern boxes in the second layer are formed per flowchart 5000, described hereinafter, in one embodiment.

In one embodiment, shot 534 represents a typical layout for patterns formed in two layers of a wafer. Shot 534 represents an internal shot on a wafer, where the first layer pattern, formed in the silicon substrate, is a repetition of a center-portion of a reticle image, e.g. C3 433a–433c. In contrast, the second layer pattern is a full-field pattern. Hence, each pattern box of the full-field pattern, e.g. pattern boxes A1–E5, overlays a nearly error-free pattern box, e.g. pattern box C3, formed from the center portion of a reticle and a center portion of a stepper lens. Consequently, the overlay of pattern in FIG. 5B shows one layer of patterns with error, e.g. patterns in second layer of material, overlaying one layer of pattern with nearly no error, e.g. first layer in silicon substrate. Thus, for example, pattern box A3 543a formed in material layer above silicon substrate, as shown in FIG. 5A, overlays pattern box C3 433a formed in silicon substrate. Similarly, pattern box C5 543c formed in material layer above silicon substrate, as shown in FIG. 5A, overlays pattern box C3 433c formed in silicon substrate. A view of two layers in one region of one shot is shown in subsequent FIG. 5D, as a side view for clarity.

While the present embodiment in FIG. 5B shows a full-field pattern of pattern boxes in second layer overlaying a corresponding set of pattern boxes formed in a first layer, the present invention is well-suited to many alternatives. For example, in one embodiment, only an outer set 540a of overlaying pattern boxes in an outer region of the shot is used for an internal shot. In another embodiment, a center set 540b of pattern boxes is utilized in the center portion of the shot in addition to the outer set 540a of overlaying pattern boxes. Besides these specific embodiments, the present invention is well-suited to using many different alternative configurations and arrangements.

Figure 5C:
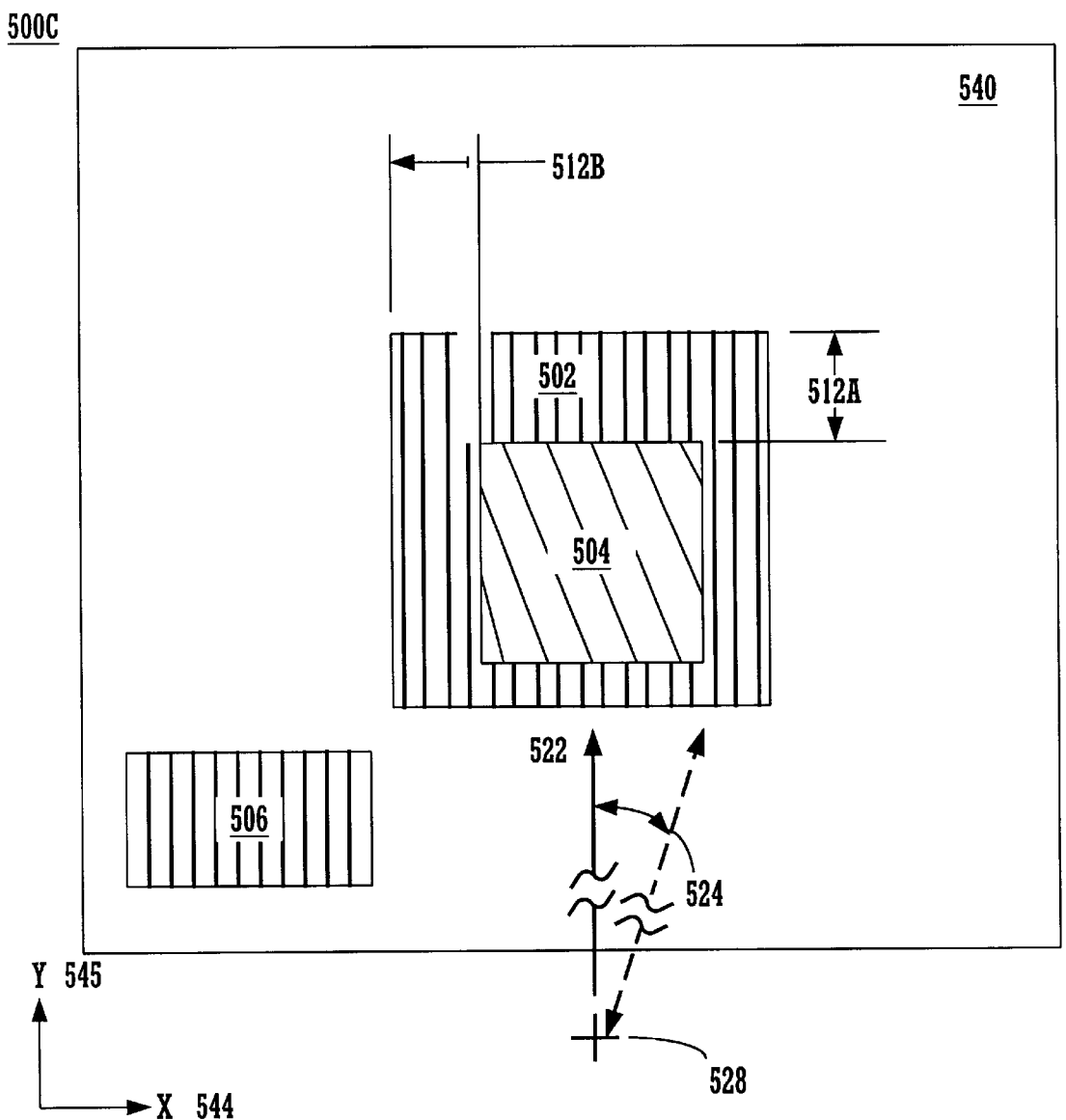
FIG. 5C is a top view of overlapping pattern boxes in two layer of a wafer, in accordance with one embodiment of the present invention.

Referring now to FIG. 5C, two layers of patterned boxes in a wafer are shown, in accordance with one embodiment of the present invention. FIG. 5C provides an exemplary set of pattern boxes 500c. Shot 500a includes a large overlay box 502, a small overlay box 504, and a fine alignment target 506, in one configuration. The overlay configuration on a wafer corresponds to patterns found in the alignment reticle shown in FIG. 3A. In another configuration, a fine alignment target 506, separate from the overlay boxes 502 and 504, is not used. This latter embodiment corresponds to the alignment reticle of FIG. 3C. In the present embodiment, large overlay box 502 encompasses small overlay box 504. However the present embodiment is well-suited to having any position of large overlay box and small overlay box and to having alternative relative sizes.

The set of pattern boxes in FIG. 5C can be from either type of shot on a wafer. That is, they can either be from an internal shot, e.g. shot 434 of FIG. 4C, or from a peripheral shot, e.g. shot 436 of FIG. 4B . Additionally, the set of pattern boxes 500c can be from either a center region of a shot, e.g. C3 543b on C3 433b of set 540b shown in FIG. 5B, or an outer region of a shot, e.g. A3 543a over C3 433a of set 540a. Note that if set of pattern boxes 500c are used as a center shot, to be used for alignment, then they also include a fine alignment target 506, in the present embodiment. Fine alignment target 506 is shown as an entity separate from alignment boxes 502 and 504. This embodiment, shown in FIG. 5C, is formed from a corresponding pattern in a reticle, e.g. image of fine alignment target 338 shown in FIG. 3B. However, in one embodiment, the alignment boxes 502 and 504 can also act as a fine alignment target. This latter embodiment is formed from a corresponding pattern in a reticle, as shown in FIG. 3C, and described therein.

FIG. 5C shows a center-line 528 that references the center portion of a shot. From the center-line 528 of the shot, radial lines, or distances, 522 project outward. Radial offset indicates the magnification error existing between two objects. In contrast, rotational offset 524 from radial line 522 indicates the rotational misalignment between two objects. In the present embodiment, pattern boxes 502 and 504 are located in the positive Y direction 545 from center-line 528 of the shot. Consequently, they represent a set of pattern boxes such as set 530a shown in FIG. 5A or set 540a shown in FIG. 5B. However, the set of pattern boxes shown in 500c is representative, in general, of any set of pattern boxes used in the present invention.

Figure 5D:
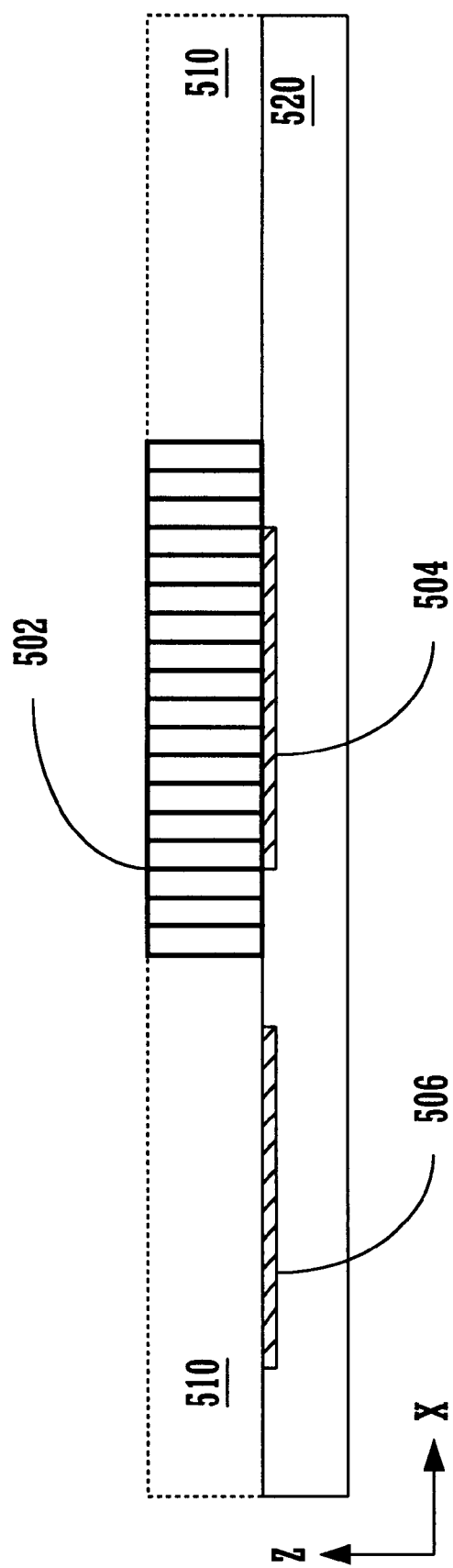
FIG. 5D is a side view of pattern boxes with alternative alignment overlays on two layer of a wafer, in accordance with one embodiment of the present invention.

Referring now to FIG. 5D, two layers of patterned boxes in a wafer are shown, in accordance with one embodiment of the present invention. FIG. 5D provides a side view of the same structure presented in FIG. 5C. Large overlay box 502 is formed from a layer of photoresist material 510, whose regions, shown as dashed lines outside of large overlay box 502, have been removed, e.g. by etching them away. Photoresist layer 510 is located adjacent to substrate 520 of the wafer in the present embodiment. However, the present invention is well-suited to using alternative layers on the substrate, in which large overlay box 502 may be formed.

In contrast, small overlay box 504 and fine alignment target 506, in FIG. 5D, are formed in the durable silicon substrate 520 of the wafer, in one embodiment. In this manner, small overlay box 504 and fine alignment target 506 are preserved for multiple alignment measurement operations. That is, a photoresist layer 510 can be repeatedly formed on, and removed from, the silicon substrate. Consequently, large overlay box 502 can be repeatedly formed in a photoresist layer can be etched away for a subsequent misalignment measurements without changing the existing small overlay box 504 and fine alignment target 506 in the substrate.

The present invention is suitable to switching which overlay box is formed in silicon and which is formed in the photo-resist layer. The present invention is also well-suited to using alternative materials in which small overlay box 504 and fine alignment target 506 may be formed. For example, one overlay box can be formed in a metal layer located on top of silicon wafer, and another overlay box can be formed in some other layer formed above metal layer. The present embodiment utilizes only silicon and photoresist layers to preserve the geometric and structural integrity of the wafer. That is, the present embodiment prevents warping and distortion that may otherwise arise from using other types of material layers and layering processes. Consequently, the present invention provides for very accurate measurements.

In one embodiment, the pattern boxes shown in FIG. 5C represent any set of pattern boxes, such as set 541b of pattern box C3 533c, formed in a new layer, located above pattern box C3 431c, formed in silicon substrate, as shown in FIG. 5C. The pattern boxes shown in FIG. 5C can represent pattern boxes in an internal shot, e.g. shot 534 shown in FIG. 5B or peripheral shot 536 shown in FIG. 5A.

Figure 5E:
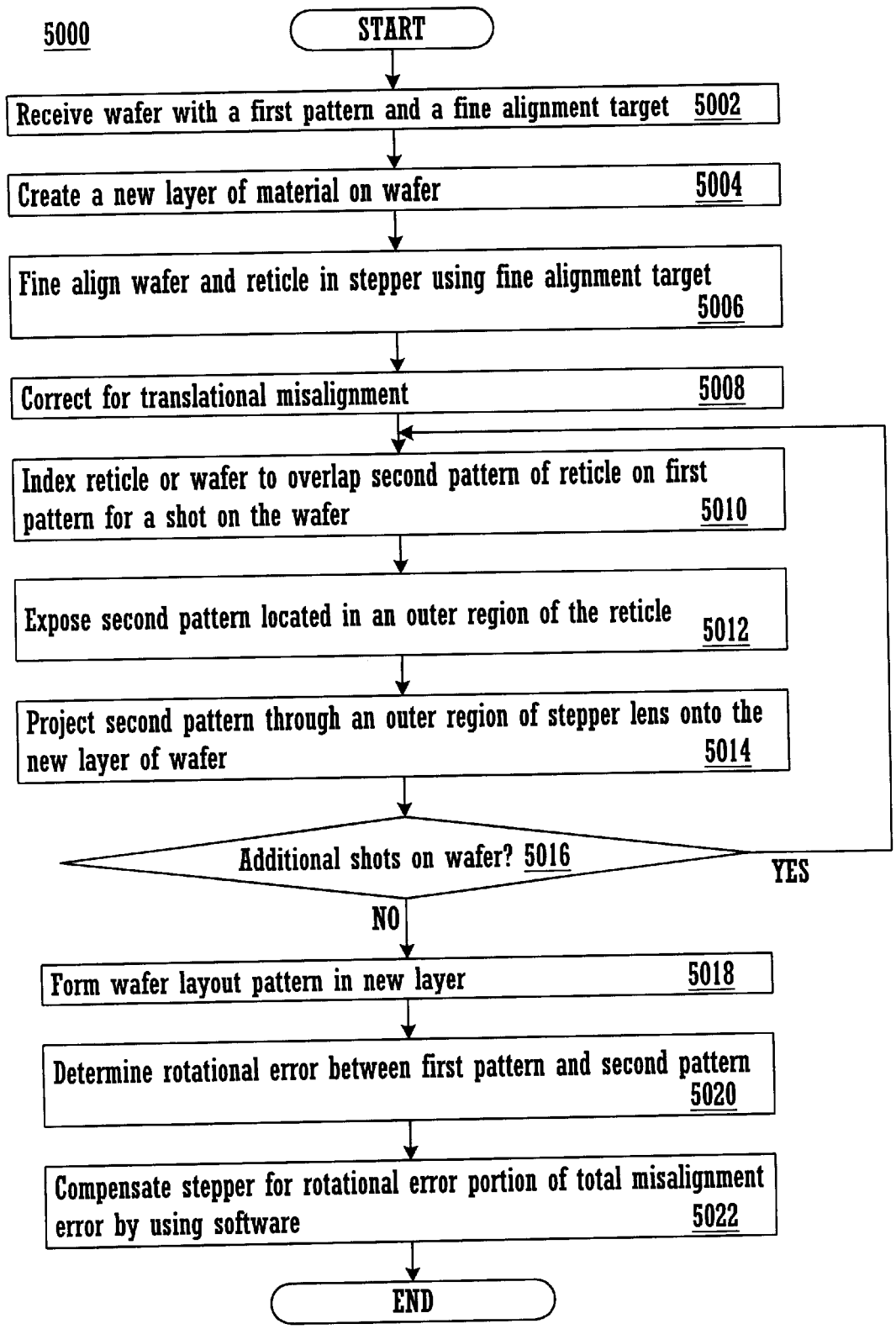
FIG. 5E is a flowchart of the steps performed to measure a rotational error portion of a total misalignment error using a Preventative Maintenance (PM) wafer, in accordance with one embodiment of the present invention.

Referring now to FIG. 5E, a flowchart of the steps performed to measure the rotational error portion of a total misalignment error between two patterns for a stepper machine is shown, in accordance with one embodiment of the present invention. By using the flowchart embodiment, the present invention provides a very accurate measurement of only the rotational portion of the total alignment error between a reticle and a wafer in a stepper. Consequently, the present invention provides better resolution, accuracy, and ultimately yield, of patterns formed in one or more layers of a wafer. While the present invention utilizes flowchart 5000 in a stepper machine, the present invention is well-suited to adapting the method of the present invention in any device needing wafer alignment.

In step 5002 of the present embodiment, a wafer with a first pattern and a fine alignment target is received. In one embodiment, the wafer is a Preventative Maintenance (PM) wafer. However, the present invention is well-suited to using any type of PM wafer or even a product-wafer having patterns suitable for misalignment measurement. FIGS. 4A through 4C show several embodiments of a PM wafer that can be used in step 5002. Specifically, FIG. 4A shows a top view of a wafer with multiple shots, e.g. shot 434 and shot 436, on it. FIG. 4B shows a layout of a peripheral shot, e.g. shot 436, while FIG. 4C shows a layout of an internal shot, e.g. shot 434. Each of the shots in this embodiment has a fine alignment target located in a center region of the shot, e.g. C3 431 b of FIG. 4B and C3 433b of FIG. 4C. However, only one shot, either internal or peripheral, with a fine alignment target, is needed in another embodiment. Furthermore, each of the internal shots has multiple first patterns in outer regions of the shot, e.g. C3 443a and C3 443d of FIG. 4C.

While the present embodiment of FIG. 4A, for step 5002, shows a wafer with multiple first patterns in each of the multiple internal shots, the present invention is well-suited to many different alternatives. For example, the peripheral shot could have the first pattern in one embodiment. In another embodiment, only a single internal shot need has either a single or multiple first pattern. Finally, first pattern and fine alignment target can have detailed shapes that correspond to wide variety of images generated by a reticle, such as those shown in FIG. 3B or FIG. 3C. Following step 5002, flowchart 5000 proceeds to step 5004. Flowchart 4000 is utilized, in one embodiment, to generate the PM wafer used in flowchart 5000.

In step 5004 of the present embodiment, a new layer of material is created on the wafer. In one embodiment, a new layer is used to form additional patterns therein, for the alignment process. In the present embodiment, a layer of photo-resistive material is applied to the silicon substrate of the wafer. In one embodiment, the additional layer is made of a material that is easily removed without harming, warping, or degrading the silicon substrate. However, the present invention is well-suited to a using a wide variety of materials with different properties for step 5004. Following step 5004, flowchart 5000 proceeds to step 5006.

In step 5006 of the present embodiment, the wafer is fine aligned in a stepper. This step is implemented, in one embodiment, utilizing the fine alignment target located in the center of a shot, e.g. located in pattern box C3 431b of peripheral shot 436 as shown in FIG. 4B or in pattern box C3 433b of internal shot 434 as shown in FIG. 4C. In one embodiment, only one fine alignment target on the wafer is utilized. In another embodiment, eight fine alignment targets located in each of the multiple peripheral shots, e.g. 436, are utilized. When using multiple fine alignment targets for aligning a wafer in a stepper, a measurement can be averaged, thereby eliminating some of the noise in fabrication and measurement. Besides the specific embodiments of the fine alignment step described here, the present invention is well-suited to using many different alternatives.

The fine alignment target in the wafer used for step 5004 is essentially an error-free fine alignment target. In order to be essentially error-free, the present invention forms the fine alignment target from a center portion of a reticle, projected through a center portion of a lens, onto a wafer that was compensated, during alignment, for translational error. By using the center of the reticle, reticle writing error was reduced, and by using the center portion of a stepper lens, lens distortion error was eliminated. Finally, by correcting the wafer for transitional error prior to forming the fine alignment target therein, the fine alignment target has no pre-existing translational error. Following step 5006, flowchart 5000 proceeds to step 5007.

In step 5008, of the present embodiment, a correction is made for the translational misalignment error between the reticle and the wafer in the stepper. The process of determining translation misalignment error is described in greater detail in co-pending US patent application Ser. No. 09/422, 912, concurrently filed herewith, entitled "Method for Determining Translation Portion of Misalignment Error In a Stepper," by Pierre Leroux, and assigned to the assignee of the present invention. This step is performed, in one embodiment, so that translational misalignment error will not affect, or be misinterpreted as, the rotational error. Consequently, the respective errors in wafer fabrication are segregated, isolated, and corrected with the appropriate control mechanisms.

In step 5010 of the present embodiment, the reticle or wafer is indexed in order to overlap a second pattern from a reticle over a first pattern in a shot on the wafer. For the present embodiment, the reticle or wafer must be indexed from a center region of a peripheral shot locations, used for the fine alignment step, to another region of an internal shot, where the second pattern will be applied. However, in another embodiment, indexing done within the same shot because the first pattern is formed in the same shot utilized for fine alignment. Step 5010 can be implemented as shown in FIG. 2, by indexing, e.g. in direction 212a, a stage 212 on which a wafer 213 is held. Alternatively, the reticle 206 can be indexed instead. Following step 5010, flowchart 5000 proceeds to step 5012.

In step 5012, of the present embodiment, a second pattern is exposed in an outer region of a reticle. In one embodiment, second pattern is a fullfield exposure of a reticle onto a shot of the wafer. Thus, for example, pattern boxes A1–A5, C1, B1–B5, C2, C4, C5, D1–D5, and E1–E5 are all exposed as outer regions of a reticle. In another embodiment, only a single pattern box can be exposed in an outer portion of a reticle. For example, only pattern box A3 of reticle 300 of FIG. 3A can be exposed as a second pattern. While the present embodiment shows specific size and shape of second pattern, the present invention is well-suited to using any size, shape, or location of second pattern that satisfies the steps of flowchart 5000. From another perspective, FIG. 2 shows how outer region 206b of reticle 206 is exposed in stepper 200a.

In one embodiment, second pattern of step 5010 is an overlaying pattern, e.g. a large overlay box, located in each of the pattern boxes, e.g. pattern boxes A1–E5 of reticle 300 in FIG. 3A. Thus, for example, large overlay box 334 or 344 of FIGS. 3B and 3C respectively, can be used as second pattern shapes for each of the pattern boxes, e.g. pattern boxes A1–E5. In this manner, pattern boxes A1–E5 for the full-field shot will overlay a nearly error-free first pattern on the wafer. Following step 5012, flowchart 5000 proceeds to step 5014.

In step 5014, of the present embodiment, the second pattern is projected through an outer region of a stepper lens onto the new layer on the wafer. This step is implemented, in one embodiment, as shown in FIG. 2, where outer region of stepper lens 208b will receive and transmit an image from an outer portion 206b of reticle. Due to the full-field aspect of exposing the second pattern, a pattern box located on an outer region of a reticle, e.g. any pattern box other than C3 333 of FIG. 3A, projected through an outer region of a stepper lens, is subject to rotational and magnification error. Consequently, the error-containing second pattern is projected over the nearly error-free first pattern etched in the silicon substrate of the wafer, in one embodiment. This allows the present embodiment to segregate the rotational error from the composite of other errors present in the alignment process, as described in subsequent steps. In one embodiment, pattern boxes in the second pattern overlay correspond in position to pattern boxes in the first pattern. Following step 5014, flowchart 5000 proceeds to step 5016.

In step 5016, of the present embodiment, an inquiry determines whether an additional shot on the wafer will be made. In one embodiment, only one shot of a second pattern is generated on the wafer. In another embodiment, a multitude of shots with a second pattern are generated on the wafer, so as to reduce noise in the process by averaging alignment results. Thus, one embodiment shown in FIG. 4A will generate twenty-one shots, eight of them peripheral and thirteen of them internal. If additional shots are to be made on the wafer, flowchart 5000 returns to step 5010. However, if additional shots are not to be made on the wafer, then flowchart 5000 proceeds to step 5018.

Step 5018 arises if additional shots will not be made on the wafer. In step 5018, in the present embodiment, the wafer layout pattern is formed in the new layer. Step 5018 includes the necessary processing steps, well-known in the art, to complete the formation of the images projected onto the wafer in the previous steps. The processing steps include the chemical etching, polishing, and other step necessary to form the second pattern in the additional layer of material. FIGS. 5C and 5D provide one embodiment where second pattern is shown as large overlay box 502 that was formed in a new layer of photo-resist material 510 located above the silicon substrate 520, in which a first pattern 504 existed. FIGS. 3B and 3C show one embodiment implementing step 5018 where large overlay box 334 or box 344 is etched into new layer 510. By forming the second pattern in the new layer, only the pattern remains, and the balance of the new material is removed, as indicated by the dashed lines of new layer 510 shown in FIG. 5D. In one embodiment, forming step 508 results in a non-permanent layer that will allow the wafer to be reused in a subsequent alignment operation. Following step 5018, flowchart 5000 proceeds to step 5020.

In step 5020 of the present embodiment, the rotational error between the first pattern and the second pattern is determined. In one embodiment, an overlay tool is utilized to determine the offset between the two patterns. In one embodiment, new layer is a photo-resist layer that is transparent. Consequently, edges of overlaying boxes in two layers can be seen and measured for misalignment. Step 5020 is implemented in one embodiment, by measuring a misalignment between a set of pattern boxes 500c in FIGS. 5C and 5D. The set of pattern boxes 500c represents just a single set of pattern boxes used for rotational error check. In another embodiment, rotational error is determined using multiple sets of pattern boxes.

Step 5020 is further implemented in FIG. 5C where the rotational error, e.g. shown in circumferential direction 524, is manifested by a gap 512b between first pattern 504 and second pattern 502. One embodiment only uses the circumferential, or rotational, misalignment measurement 512b for the rotational error measurement. This is because, as the rotational error increases, objects located at a given radius are moved to a different circumferential location. Rotational error does not change the radius at which the object is located, in the present embodiment. Rather, rotational error causes circumferential movement, approximated as gap 512a in FIG. 5C.

In the implementation of step 5020 by FIG. 5C, the offset in the circumferential direction 524 can be calculated in the Cartesian coordinate system or the more optimal cylindrical or spherical coordinate system. However, if pattern boxes used for measurements are chosen by strategic location, e.g. in line with one of the axes of a Cartesian coordinate system, then the measurement is made easier. That is, if the circumferential direction approximately coincides with an axis, e.g. circumferential direction 524 approximately coincides with the X axis 544 for small angles between boxes 504 and 502 in the present embodiment, then the rotational misalignment measurement consists of reading only a single Cartesian coordinates, e.g. the X coordinates of two boxes. Consequently, the rotational error, represented by circumferential misalignment, is determined simply by the X offset, e.g. gap 512b, between two patterns originally intended to directly overlap each other. In another embodiment, the X and Y coordinates can be utilized to calculate a more accurate circumferential change in location between two objects, e.g. pattern boxes or overlays. The latter embodiment may be utilized for larger angles of rotational misalignment. In another embodiment, multiple sets of pattern boxes are averaged together to obtain a reduced-noise result for rotational error measurement.

One embodiment of step 5020, that uses multiple sets of pattern boxes, includes only sets of pattern boxes that align with the axes of the stepper, or the measurement configuration. Thus, for example, the sets of this embodiment would include set 540a, 540c, 540d and 540e shown in FIG. 5B. Set 540a would indicate rotational misalignment by the X direction 544 offset between pattern boxes intended to directly align. Set 540c would indicate rotational misalignment by the Y direction 545 offset between pattern boxes intended to directly align. Set 540d would indicate rotational misalignment by the X direction 544 offset between pattern boxes intended to directly align. And set 540e would indicate rotational misalignment by the Y direction 545 offset between pattern boxes intended to directly align. Furthermore, these sets of pattern boxes are on the outer edge of the shot. Hence, they would provide the most extreme magnification error, in general, that would exist with a stepper lens. In one embodiment, positive or negative signs can be utilized to indicate direction of rotation, e.g. using clockwise vs. counterclockwise notation or using right-hand-rule notation, of the pattern boxes. In this manner, the direction of rotation can be accounted for. In another embodiment, the results can be nominalized by using an absolute value of independent results or the final result. While the present embodiment utilizes specific sets of pattern boxes, the present invention is well-suited to using any of the sets of pattern boxes in a shot.

In contrast to the rotational error aspect of step 5020, magnification error will cause objects to move radially from the center of the shot. However, magnification error is compensated by a different portion of the stepper, in one embodiment. Magnification error portion of the total misalignment between boxes 502 and 504 of FIG. 5C is shown by a radial offset 512a. In the present embodiment, radial offset coincides with the Y axis. However, for different box locations, X and Y coordinates may be used to calculate the radial offset or radial misalignment. The magnification portion of the error is compensated separately in the stepper, for the present embodiment.

Because a correction for translational misalignment error was implemented in flowchart 5000, translation error does not contribute to the error in the rotational measurement of present step 5020. In one embodiment, where numerous shots are made of the first and second pattern, e.g. as shown in FIG. 5B, the rotational misalignment measurement can be determined using various averaging or weighting methods, depending upon the application and desired result. In one embodiment, if no rotational error exists between the reticle and the wafer in the stepper, large overlay box 502 would have an equal gap between small overlay box 504 in the X direction, e.g. gap 512b would be the same as the gap on the opposite side of the two boxes. In another embodiment, a nominal offset can intentionally be generated between the overlay boxes. In that case, the translational misalignment measurement or the rotational misalignment measurement would consider the nominal offsets used. Following step 5020, flowchart 5000 proceeds to step 5022.

In step 5022 of the present embodiment, the stepper is compensated for the rotational portion of the misalignment error, measured in the previous step, with a software adjustment. By using software, the mechanical setup of the machine does not need to be adjusted. However, the present invention is well-suited to alternative means of implementing the correction for rotational error, such as mechanically altering the stepper setup or the stepper lens. By implementing the correction on the stepper, images can accurately be formed from the reticle to the wafer, thus increasing the yield of the product. Following step 5022, flowchart 5000 ends. The present embodiment allows the steps of flowchart 5000 to be repeated using the same wafer, as discussed in FIGS. 5C and 5D and in the previous steps.

While flowchart 5000 of the present embodiment shows a specific sequence and quantity of steps, the present invention is suitable to alternative embodiments. For example, not all the steps provided for flowchart 5000 are required for the present invention. And additional steps may be added to those presented. Likewise, the sequence of the steps can be modified depending upon the application. Furthermore, while flowchart 5000 is shown as a single serial process, it can also be implemented as a continuous or parallel process. Many of the instructions for the steps, and the data input and output from the steps, of flowchart 5000 utilize memory and utilize controller hardware shown in a subsequent figure.

Figure 6:
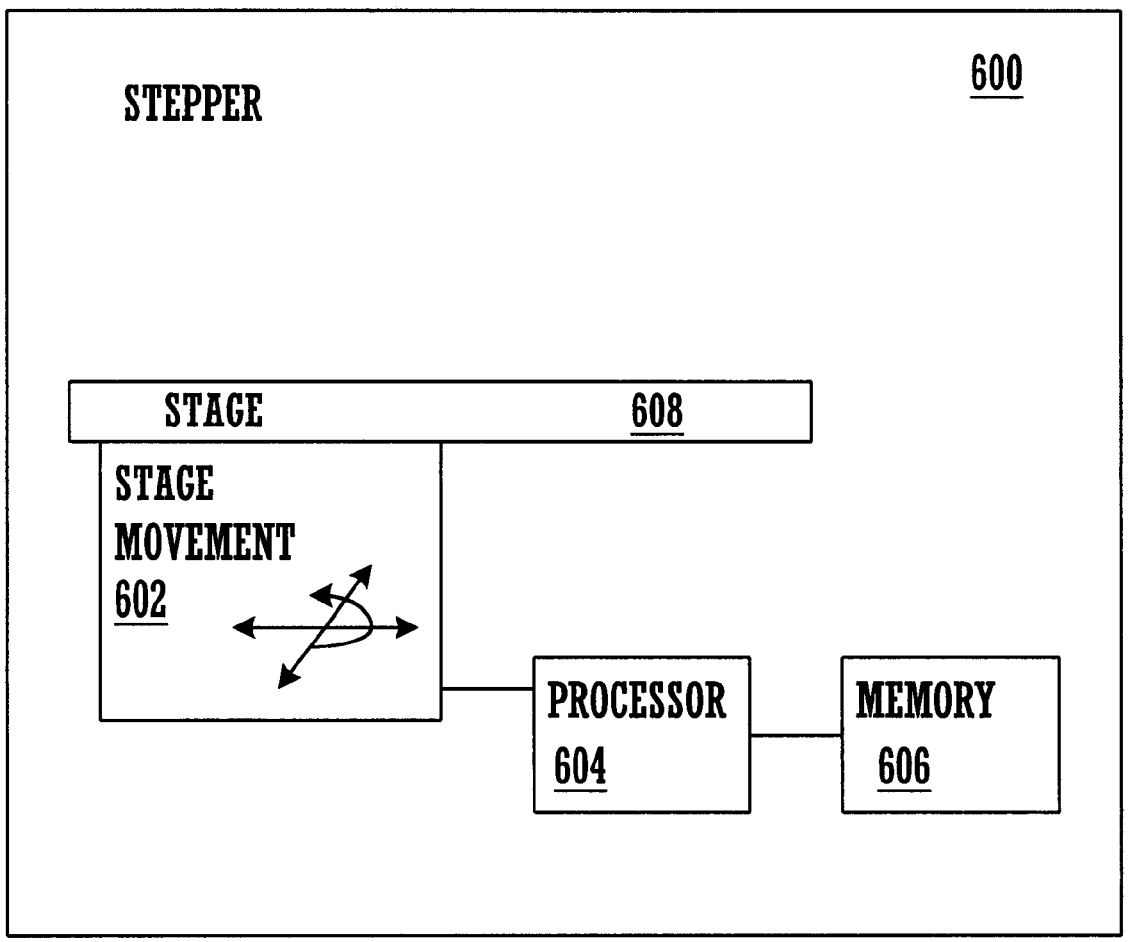
FIG. 6 is a stepper having the improved translation error measurement procedure, in accordance with one embodiment of the present invention.

Referring now to FIG. 6, a stepper using the improved translation error measurement procedure, in accordance with one embodiment of the present invention. Stepper 600 includes a stage 608 coupled to a stage movement device 602, a processor, and a memory 606. Memory 606 contains program instructions that, when implemented through processor 604, allow stepper 600 to implement the steps used in the present invention to measure the translation portion of a misalignment error between two patterns on a wafer.

Memory 606 for the present embodiment can either be permanent, such as read only memory (ROM), or temporary memory such as random access memory (RAM). Memory 606 can also be any other type of memory storage, capable of containing program instructions, such as a hard drive, a CD ROM, or flash memory. Furthermore, processor 604 can either be a an existing system processor or microprocessor, be a dedicated digital signal processing (DSP) processor unit, or a dedicated controller or microcontroller. Alternatively, the instructions may be implemented using an implementation of a state machine.

Many of the instructions for the steps, and the data input and output from the steps, of flowcharts 4000 and 5000 utilize memory and utilize controller hardware shown in FIG. 6. For example, stepper blades 204, reticle location, wafer location, and/or stage 212, lighting source 202, can be controlled by memory 606 and processor 604 to accomplish the requirements of each step of flowcharts 4000 and 5000. Similarly, step 5022 of flowchart 5000 can be implemented in one embodiment, by storing correction for translation error in memory 606, and executing the correction for translation error for subsequent wafer processing by using processor 604. The alternative embodiments of FIG. 6 are equally applicable to implementing the steps of flowchart 4000 and 5000.

In summary, the present invention provides an apparatus and a method for ensuring accurate alignment of multiple layers formed on a wafer. Additionally, the present invention improves the accuracy of the misalignment measurement for the stepper. That is, to measure, and compensate for, the true misalignment caused by the stepper, the present invention provides an alignment method that does not add additional errors beyond the true misalignment of the stepper. Furthermore, the present invention improves the accuracy of the misalignment measurement for the stepper. That is, to measure, and compensate for, the true misalignment caused by the stepper, the present invention provides an alignment method that does not add additional errors beyond the true misalignment of the stepper. Consequently, the present invention creates an error-free alignment target. More specifically, the present invention creates an alignment target without reticle writing error, offset-measurement error, and lens distortion error.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the Claims appended hereto and their equivalents.

I claim:

1. In a stepper, a method of determining a rotational error portion of a total misalignment error for a wafer, said method comprising the steps of:

a) receiving said wafer, said wafer having a first pattern, wherein said first pattern is located in an outer region of any shot and a fine alignment target formed therein, said fine alignment target located in a center region of a first shot;

b) aligning said wafer in said stepper using said fine alignment target;

c) creating a second pattern on said wafer, said second pattern overlaying said first pattern; and d) measuring a circumferential misalignment between said first pattern and said second pattern to obtain said rotational error portion of said total misalignment error.

2. The method recited in claim 1 wherein said fine alignment target in said wafer is approximately error-free.

3. The method recited in claim 1, further comprising the step of:

e) compensating said stepper for a translational misalignment portion of said total misalignment error for said wafer.

4. The method recited in claim 1 wherein said first pattern is an approximately error-free overlay.

5. The method recited in claim 4 wherein said second pattern is an overlay having rotational error, said second pattern corresponding in position to said first pattern.

6. The method recited in claim 1, further comprising the step of:

e) creating a layer of material on said wafer, said second pattern formed in said layer of material.

7. The method recited in claim 6 wherein said layer of material is a photo-resist material.

8. The method recited in claim 1 wherein step c) comprises the steps of:

c1) exposing an image of said second pattern, said image of said second pattern located in an outer region of a reticle; and c2) projecting said image of said second pattern through an outer region of a stepper lens onto said wafer.

9. The method recited in claim 1 wherein said wafer is a Preventative Maintenance (PM) wafer.

10. The method recited in claim 1 wherein said first pattern is a duplicate fine alignment target.

11. The method recited in claim 10 wherein said second pattern is a mating overlay for at least a portion of said duplicate fine alignment target.

12. The method recited in claim 1 wherein said first pattern is approximately error-free.

* * * * *